(12) United States Patent
He

(10) Patent No.: US 9,576,543 B2
(45) Date of Patent: Feb. 21, 2017

(54) SHIFT REGISTER, GATE DRIVING UNIT AND DISPLAY DEVICE PERFORMING SCANNING SEQUENCE CONTROL

(71) Applicants: HEFEI BOE OPTOELECTRONICS TECHNOLOGY CO., LTD., Anhui (CN); BOE TECHNOLOGY GROUP CO., LTD., Beijing (CN)

(72) Inventor: Jian He, Beijing (CN)

(73) Assignees: HEFEI BOE OPTOELECTRONICS TECHNOLOGY CO., LTD., Hefei, Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 160 days.

(21) Appl. No.: 14/239,233

(22) PCT Filed: Aug. 13, 2013

(86) PCT No.: PCT/CN2013/081348
§ 371 (c)(1),
(2) Date: Feb. 17, 2014

(87) PCT Pub. No.: WO2014/183345
PCT Pub. Date: Nov. 20, 2014

(65) Prior Publication Data
US 2015/0029083 A1   Jan. 29, 2015

(30) Foreign Application Priority Data

May 14, 2013  (CN) .......................... 2013 1 0178466

(51) Int. Cl.
*G09G 3/36*  (2006.01)
*G11C 19/28*  (2006.01)

(52) U.S. Cl.
CPC .......... *G09G 3/3648* (2013.01); *G09G 3/3659* (2013.01); *G09G 3/3677* (2013.01);
(Continued)

(58) Field of Classification Search
CPC .............. G09G 3/34; G09G 3/36; G09G 3/30; G09G 5/00; G11C 19/00; G06F 3/038
(Continued)

(56) References Cited

U.S. PATENT DOCUMENTS

2007/0296682 A1* 12/2007 Hwang ................ G09G 3/3677
345/100
2008/0001904 A1  1/2008  Kim et al.
(Continued)

FOREIGN PATENT DOCUMENTS

CN   101078848 A   11/2007
CN   101122720 A   2/2008
(Continued)

OTHER PUBLICATIONS

First Chinese Office Action dated Sep. 4, 2014; Appln. No. 201310178466.6.
(Continued)

*Primary Examiner* — Pegeman Karimi
(74) *Attorney, Agent, or Firm* — Ladas & Parry LLP

(57) ABSTRACT

Provided are a shift register, a gate driving unit and a display device. By disposing a scanning sequence control circuit configured to control output sequence of a first gate signal and a second gate signal according to the received first and second scanning sequence control signals, a first control circuit and a second control circuit in the shift register unit, it may settle a Vertical mura problem in the prior art and may improve an image quality of the display device.

17 Claims, 8 Drawing Sheets

(52) U.S. Cl.
CPC ..... *G11C 19/28* (2013.01); *G09G 2310/0286* (2013.01); *G09G 2310/08* (2013.01)

(58) Field of Classification Search
USPC ........................................................ 345/100
See application file for complete search history.

(56) References Cited

U.S. PATENT DOCUMENTS

| | | |
|---|---|---|
| 2010/0214279 A1 | 8/2010 | Kim et al. |
| 2011/0273417 A1* | 11/2011 | Shin ........................ G09G 3/20 |
| | | 345/211 |
| 2014/0168044 A1 | 6/2014 | Hu et al. |

FOREIGN PATENT DOCUMENTS

| | | |
|---|---|---|
| CN | 101295481 A | 10/2008 |
| CN | 102237031 A | 11/2011 |
| CN | 103035298 A | 4/2013 |
| CN | 103236248 A | 8/2013 |

OTHER PUBLICATIONS

Written Opinion of the International Searching Authority dated Feb. 14, 2014; PCT/CN2013/081348.
Second Chinese Office Action dated Jan. 26, 2015; Appln. No. 201310178466.6.
International Search Report Issued Feb. 14, 2013; Appln. No. PCT/CN2013/081348.

* cited by examiner

SHIFT REGISTER, GATE DRIVING UNIT AND DISPLAY DEVICE PERFORMING SCANNING SEQUENCE CONTROL

TECHNICAL FIELD

The present disclosure relates to a field of display, and particularly to a shift register, a gate driving unit and a display device.

BACKGROUND

A liquid crystal display (LCD) device includes a liquid crystal panel with a plurality of gate lines and a plurality of data lines, a gate driving unit for outputting gate signals to the gate lines, and a source driving unit for outputting data signals to the data lines.

With developments in technologies, various driving technologies that may reduce cost, including a Dual gate technology and a GIP (gate in panel) technology, are being applied to liquid crystal display products.

The Dual gate technology is a driving technology which reduces the number of the data lines of a LCD panel by a half and doubles the number of the gate lines. Because a unit price of gate driving ICs is lower than that of source driving ICs, the Dual gate technology can reduce cost by reducing the number of the source driving ICs by a half and doubling the number of the gate driving ICs. However, the Dual gate technology may bring a problem of insufficient charging in TFTs.

The GIP technology is a technology which integrates a gate driving circuit in a peripheral area of a display area of the LCD panel. The GIP technology eliminates the gate driving ICs, and thus can reduce cost.

In order to further reduce costs, some LCD products employs both of the Dual gate technology and the GIP technology.

The current gate driving circuit which employs the GIP technology may only perform the display by way of single direction scan, e.g., a sequential scan or a reverse scan. When applying the GIP technology in combination with the Dual gate technology, the problem of insufficient charging may cause a Vertical mura problem, resulting in a poor image quality.

SUMMARY

Embodiments of the present disclosure provide a shift register, a gate driving unit and a display device, which may settle the Vertical mura problem in the prior art and may improve the image quality of the display device.

Embodiments of the present disclosure provide the following solutions.

An embodiment of the present disclosure provides a shift register unit, which comprises a scanning sequence control circuit, a first control circuit and a second control circuit; wherein:

the scanning sequence control circuit is connected to a first scanning sequence control signal input terminal, a second scanning sequence control signal input terminal, a first clock signal input terminal, a second clock signal input terminal, a set signal input terminal, a reset signal input terminal, a first gate signal output terminal, a second gate signal output terminal, a carry signal output terminal, a reset signal output terminal, respectively, and the scanning sequence control circuit is configured to control output sequences of a first gate signal and a second gate signal according to the received first scanning sequence control signal and second scanning sequence control signal;

the first control circuit is configured to output and reset the first gate signal according to the control signals input from the scanning sequence control circuit, and the first control circuit is connected to a frame reset signal input terminal, a power supply voltage input terminal, the first gate signal output terminal and the scanning sequence control circuit, respectively;

the second control circuit is configured to output and reset a second gate signal according to the control signals input from the scanning sequence control circuit, and the second control circuit is connected to the frame reset signal input terminal, the power supply voltage input terminal, the second gate signal output terminal and the scanning sequence control circuit, respectively.

Preferably, the scanning sequence control circuit comprises:

a first control unit, which is configured to input a first sub-set signal and a first sub-reset signal to the first control circuit and receive a first sub-carry signal input from the first control circuit, wherein the first control unit is connected to the first scanning sequence control signal input terminal, the set signal input terminal, the reset signal input terminal, the first gate signal output terminal, the carry signal input terminal, and the reset signal output terminal, respectively;

a second control unit, which is configured to input a second sub-set signal and a second sub-reset signal to the second control circuit and receive a second sub-carry signal input from the second control circuit, wherein the second control unit is connected to the second scanning sequence control signal input terminal, the set signal input terminal, the reset signal input terminal, the second gate signal output terminal, the carry signal input terminal and the reset signal output terminal, respectively;

a clock signal control unit, which is configured to input a first clock sub-signal and a second clock sub-signal to the first control circuit or the second control circuit, wherein the clock signal control unit is connected to the first scanning sequence control signal input terminal, the second scanning sequence control signal input terminal, the first clock signal input terminal and the second clock signal input terminal, respectively.

Preferably, the first control unit comprises:

A first transistor TC1, a third transistor TC3, a fifth transistor TC5, a seventh transistor TC7, a ninth transistor TC9, a eleventh transistor TC11; wherein:

a source of the first transistor TC1 is connected to the set signal input terminal, a gate of the first transistor TC1 is connected to the first scanning sequence control signal input terminal, and a drain of the first transistor TC1 is connected to the first control circuit;

a source of the third transistor TC3 is connected to the first control circuit, a gate of the third transistor TC3 is connected to the first scanning sequence control signal input terminal, and a drain of the third transistor TC3 is connected to the second control circuit;

a source of the fifth transistor TC5 is connected to the second gate signal output terminal, a gate of the fifth transistor TC5 is connected to the first scanning sequence control signal input terminal, and a drain of the fifth transistor TC5 is connected to the first control circuit;

a source of the seventh transistor TC7 is connected to the second control circuit, a gate of the seventh transistor TC7 is connected to the first scanning sequence control signal input terminal, and a drain of the seventh transistor TC7 is connected to the carry signal output terminal;

a source of the ninth transistor TC9 is connected to the reset signal input terminal, a gate of the ninth transistor TC9 is connected to the first scanning sequence control signal input terminal, and a drain of the ninth transistor TC9 is connected to the second control circuit;

a source of the eleventh transistor TC11 is connected to the first gate signal output terminal, a gate of the eleventh transistor TC11 is connected to the first scanning sequence control signal input terminal, and a drain of the eleventh transistor TC11 is connected to the reset signal output terminal.

Preferably, the second control unit comprises:

a second transistor TC2, a fourth transistor TC4, a sixth transistor TC6, a eighth transistor TC8, a tenth transistor TC10, and a twelfth transistor TC12; wherein:

a source of the second transistor TC2 is connected to the set signal input terminal, a gate of the second transistor TC2 is connected to the second scanning sequence control signal input terminal, and a drain of the second transistor TC2 is connected to the second control circuit;

a source of the fourth transistor TC4 is connected to the second control circuit, a gate of the fourth transistor TC4 is connected to the second scanning sequence control signal input terminal, and a drain of the fourth transistor TC4 is connected to the first control circuit;

a source of the sixth transistor TC6 is connected to the first gate signal output terminal, a gate of the sixth transistor TC6 is connected to the second scanning sequence control signal input terminal, and a drain of the sixth transistor TC6 is connected to the second control circuit;

a source of the eighth transistor TC8 is connected to the first control circuit, a gate of the eighth transistor TC8 is connected to the second scanning sequence control signal input terminal, and a drain of the eighth transistor TC8 is connected to the carry signal output terminal;

a source of the tenth transistor TC10 is connected to the reset signal input terminal, a gate of the tenth transistor TC10 is connected to the second scanning sequence control signal input terminal, and a drain of the tenth transistor TC10 is connected to the first control circuit;

a source of the twelfth transistor TC12 is connected to the second gate signal output terminal, a gate of the twelfth transistor TC12 is connected to the second scanning sequence control signal input terminal, and a drain of the twelfth transistor TC12 is connected to the reset signal output terminal.

Preferably, the clock signal control unit comprises:

a thirteenth transistor TC13, a fourteenth transistor TC14, a fifteenth transistor TC15, and a sixteenth transistor TC16; wherein:

a source of the thirteenth transistor TC13 is connected to the first clock signal input terminal, a gate of the thirteenth transistor TC13 is connected to the first scanning sequence control signal input terminal, and a drain of the thirteenth transistor TC13 is connected to the first control circuit and the second control circuit;

a source of the fourteenth transistor TC14 is connected to the first clock signal input terminal, a gate of the fourteenth transistor TC14 is connected to the second scanning sequence control signal input terminal, and a drain of the fourteenth transistor TC14 is connected to the first control circuit and the second control circuit;

a source of the fifteenth transistor TC15 is connected to the second clock signal input terminal, a gate of the fifteenth transistor TC15 is connected to the first scanning sequence control signal input terminal, and a drain of the fifteenth transistor TC15 is connected to the first control circuit and the second control circuit;

a source of the sixteenth transistor TC16 is connected to the second clock signal input terminal, a gate of the sixteenth transistor TC16 is connected to the second scanning sequence control signal input terminal, and a drain of the sixteenth transistor TC16 is connected to the first control circuit and the second control circuit.

Preferably, the first control circuit comprises: a buffering unit, a charging unit, a pulling-up unit, a carry signal generating unit, a pulling-down unit, a discharging unit and a holding unit, wherein:

The buffering unit comprises a transistor TA4, and a source and a gate of the transistor TA4 are connected to the drain of the first transistor TC1 and the drain of the fourth transistor TC4 in the scanning sequence control circuit, and a drain of the transistor TA4 is connected to a pulling-up node;

the charging unit comprises a capacitor CA6, and a first terminal of the capacitor CA6 is connected to the pulling-up node, a second terminal of the capacitor CA6 is connected to the first gate signal output terminal;

The pulling-up unit comprises a transistor TA1, and a source of the transistor TA1 is connected to the drain of the thirteenth transistor TC13 and the drain of the sixteenth transistor TC16 in the scanning sequence control circuit, a gate of the transistor TA1 is connected to the first terminal of the capacitor CA6, and a drain of the transistor TA1 is connected to the first gate signal output terminal;

the carry signal generating unit comprises a transistor TA15 and a capacitor CA7, wherein, a source of the transistor TA15 is connected to the drain of the thirteenth transistor TC13 and the drain of the sixteenth transistor TC16 in the scanning sequence control circuit, respectively, a gate of the transistor TA15 is connected to a first terminal of the capacitor CA7 and the pulling-up node PU, respectively, and a drain of the transistor TA15 is connected to a second terminal of the capacitor CA7, the source of the third transistor TC3 and the source of the eighth transistor TC8 in the scanning sequence control circuit, respectively;

the pulling-down unit comprises a transistor TA2 and a transistor TA9, wherein, a source of the transistor TA2 is connected to the first gate signal output terminal, a source of the transistor TA9 is connected to the pulling-up node, a gate of the transistor TA2 and a gate of the transistor TA9 are connected to the drain of the fifth transistor TC5 and the drain of the tenth transistor TC10 in the scanning sequence control circuit, respectively, and a drain of the transistor TA2 and a drain of the transistor TA9 are connected to the power supply voltage input terminal;

the discharging unit comprises a transistor TA6, and a source of the transistor TA6 is connected to the pulling-up node PU, a gate of the transistor TA6 is connected to the frame reset signal input terminal, a drain of the transistor TA6 is connected to the power supply voltage input terminal;

the holding unit comprises a transistor TA3, a transistor TA5, a transistor TA7, a transistor TA8, a transistor TA10, a transistor TA11, a transistor TA12, a transistor TA13, a capacitor CA8 and a capacitor CA9, wherein, a source of the transistor TA11 is connected to the drain of the first transistor TC1 and the drain of the fourth transistor TC4 in the scanning sequence control circuit, respectively; gates of the transistor TA11 and the transistor TA5 are connected to the drain of the fourteenth transistor TC14 and the drain of the fifteenth transistor TC15 in the scanning sequence control circuit; a drain of the transistor TA11 is connected to a source of the transistor TA10 and the pulling-up node PU, respectively; a gate of the transistor TA10, a source and a gate of the transistor TA12, a first terminal of the capacitor CA8, and a source of the transistor TA7 are commonly connected to the drain of the thirteenth transistor TC13 and the drain of the sixteenth transistor TC16 in the scanning sequence control circuit; a drain of the transistor TA10, a source of the transistor TA5, a gate of the transistor TA13, a gate of the transistor TA8, a source of the transistor TA3 are commonly connected to the second terminal of the capacitor CA6 and the first gate signal output terminal; a drain of the transistor TA5, a drain of the transistor TA13, a drain of the transistor TA8, and a drain of the transistor TA3 are commonly connected to the power supply voltage input terminal; a drain of the transistor TA12 is connected to a gate of the transistor TA7, a source of the transistor TA13, a second terminal of the capacitor CA8 and a first terminal of the capacitor CA9, respectively; and a drain of the transistor TA7, a second terminal of the capacitor CA9, a source of the transistor TA8 and a gate of the transistor TA3 are connected to the pulling-down node PD.

Preferably, the second control circuit comprises: a buffering unit, a charging unit, a pulling-up unit, a carry signal generating unit, a pulling-down unit, a discharging unit and a holding unit, wherein:

the buffering unit comprises a transistor TB4, and a source and a gate of the transistor TB4 are coupled to the drain of the second transistor TC2 and the drain of the third transistor TC3 in the scanning sequence control circuit, and a drain of the transistor TB4 is connected to the pulling-up node;

the charging unit comprises a capacitor CB6, and a first terminal of the capacitor CB6 is connected to the pulling-up node, a second terminal of the capacitor CB6 is connected to the second gate signal output terminal;

the pulling-up unit comprises a transistor TB1, and a source of the transistor TB1 is connected to the drain of the fourteenth transistor TC14 and the drain of the fifteenth transistor TC15 in the scanning sequence control circuit, a gate of the transistor TB1 is connected to the first terminal of the capacitor CB6, and a drain of the transistor TB1 is connected to the second gate signal output terminal;

the carry signal generating unit comprises a transistor TB15 and a capacitor CB7, wherein, a source of the transistor TB15 is connected to the drain of the fourteenth transistor TC14 and the drain of the fifteenth transistor TC15 in the scanning sequence control circuit, respectively, a gate of the transistor TB15 is connected to a first terminal of the capacitor CB7 and the pulling-up node PU, respectively, and a drain of the transistor TB 15 is connected to a second terminal of the capacitor CB7, the source of the fourth transistor TC4 and the source of the seventh transistor TC7 in the scanning sequence control circuit, respectively;

the pulling-down unit comprises a transistor TB2 and a transistor TB9, wherein, a source of the transistor TB2 is connected to the second gate signal output terminal, a source of the transistor TB9 is connected to the pulling-up node, gates of the transistors TB2 and TB9 are connected to the drains of the sixth and the ninth transistors TC6 and TC9 in the scanning sequence control circuit, respectively, and drains of the transistors TB2 and TB9 are connected to the power supply voltage input terminal;

the discharging unit comprises a transistor TB6, and a source of the transistor TB6 is connected to the pulling-up node PU, a gate of the transistor TB6 is connected to the frame reset signal input terminal, and a drain of the transistor TB6 is connected to the power supply voltage input terminal;

the holding unit comprises a transistor TB3, a transistor TB5, a transistor TB7, a transistor TB8, a transistor TB10, a transistor TB11, a transistor TB 12, a transistor TB 13, a capacitor CB8 and a capacitor CB9, wherein, a source of the transistor TB11 is connected to the drains of the second and third transistors TC2 and TC3 in the scanning sequence control circuit, respectively; gates of the transistors TB 11 and TB5 are connected to the drains of the thirteenth and sixteenth transistors TC13 and TC16 in the scanning sequence control circuit; a drain of the transistor TB 11 is connected to a source of the transistor TB 10 and the pulling-up node PU, respectively; a gate of the transistor TB10, a source and a gate of the transistor TB12, a first terminal of the capacitor CB8, a source of the transistor TB7 are commonly connected to the drains of the fourteenth and fifteenth transistors TC14 and TC15 in the scanning sequence control circuit; a drain of the transistor TB 10, a source of the transistor TB5, a gate of the transistor TB 13, a gate of the transistor TB8, a source of the transistor TB3 are commonly connected to the second terminal of the capacitor CB6 and the second gate signal output terminal; drains of the transistors TB5, TB 13, TB8, TB3 are commonly connected to the power supply voltage input terminal; a drain of the transistor TB12 is connected to a gate of the transistor TB7, a source of the transistor TB13, a second terminal of the capacitor CB8 and a first terminal of the capacitor CB9, respectively; and a drain of the transistor TB7, a second terminal of the capacitor CB9, a source of the transistor TB8, and a gate of the transistor TB3 are connected to the pulling-down node PD.

An embodiment of the present disclosure also provides a gate driving unit, which comprises a plurality of shift register units, according to the above embodiment of the present disclosure, which are connected in cascade.

The set signal input terminal of each of the remaining stages of the shift registers is connected to the carry signal output terminal of a previous stage of the shift register, except that the set signal input terminal of the first stage of shift register is connected to a clock generating unit.

The reset signal input terminal of each of the remaining stages of the shift registers is connected to the reset signal output terminal of a next stage of the shift register, except that the reset signal input terminal of the last stage of shift register is connected to the clock generating unit.

An embodiment of the present disclosure also provides a display device, which comprises the gate driving units according to the above embodiment of the present disclosure;

the display device further comprising:

a timing controller, configured to generate a stage scanning sequence control signal;

a voltage generating unit, configured to generate a gate on voltage and a gate off voltage;

a clock generating unit, configured to generate a first scanning sequence control signal and a second scanning sequence control signal based on the stage scanning sequence control signal, the gate on voltage and the gate off voltage.

Preferably, when the stage scanning sequence control signal is at a high level, the first scanning sequence control signal is the gate on voltage, and the second scanning sequence control signal is the gate off voltage;

when the stage scanning sequence control signal is at a low level, the first scanning sequence control signal is the gate off voltage, and the second scanning sequence control signal is the gate on voltage.

It can be seen from the above description that the shift register, the gate driving unit and the display device according to the present disclosure dispose a scanning sequence control circuit configured to control output sequences of a first gate signal and a second gate signal according to the received first and second scanning sequence control signals, a first control circuit and a second control circuit in the shift register unit, thereby may settle the Vertical mura problem in the prior art, and may improve the image quality of the display device.

DETAILED DESCRIPTION

In order to make objects, technical solutions and advantages of the embodiments of the present disclosure apparent, the technical solutions of the embodiments of the present disclosure will be described fully and clearly below with reference to the accompanying drawings thereof. It is obvious that the described embodiments are not all of but merely a portion of the embodiments of the invention. All further embodiments that those ordinary skilled in the related art can derive from the embodiments of the present disclosure without paying inventive efforts belong to the protection scope of the invention.

Unless otherwise defined, the technical terms or scientific terms used herein have the same meanings as commonly understood by one of ordinary skill in the art to which this invention belongs. The terms such as first, second, and so on that are used in the specification and the claims are not intended to indicate any sequence, quantity or significance, but are only used to distinguish different components. Similarly, the singular forms such as "a", "an" as used herein are not intended to limit quantity, but indicate there are at least one related objects. Terms such as "connected to" or "coupled to" are not limited to physical or mechanical connections, but may include electrical connections, no matter the connections are direct or indirect. Relative terms, such as "upper," "lower," "left" or "right," may be used herein to describe relative spatial relationships, and when absolute orientation of a described object is changed, the relative spatial relationships will be changed accordingly.

Figure 1:
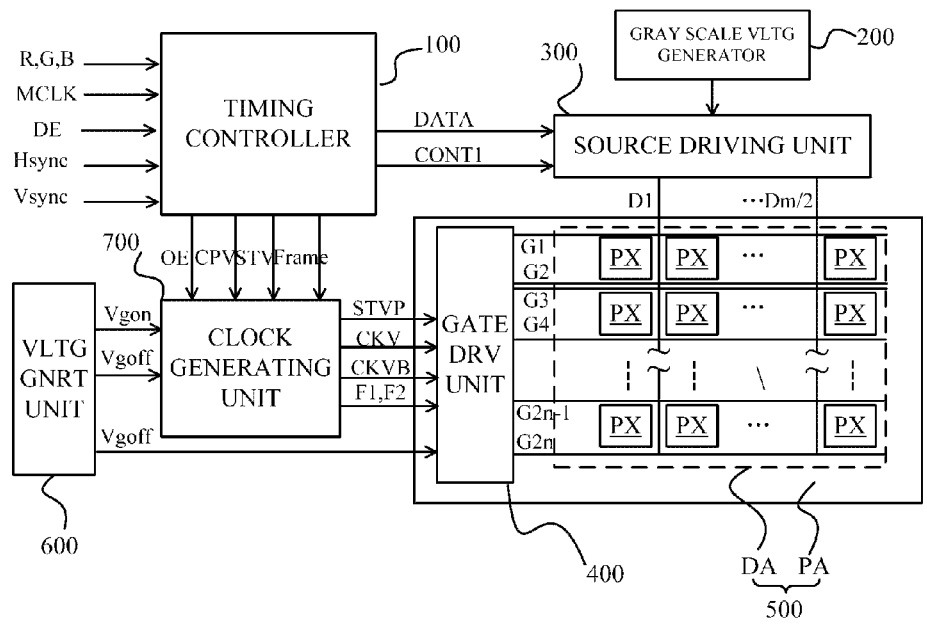
FIG. 1 is a schematic diagram illustrating a structure of a display device according to an embodiment of the present disclosure.

An embodiment of the present disclosure provides a display device, as illustrated in FIG. 1, and the device may particularly comprise a timing controller 100, a gray scale voltage generator 200, a source driving unit 300, a gate driving unit 400, a liquid crystal panel 500, a voltage generating unit 600, and a clock generating unit 700.

The liquid crystal panel 500 is divided into a display region DA for displaying images and a non-display region PA.

Pixels of the display region DA are arranged in n rows and m columns. Because the Dual gate technology is applied, the DA includes a plurality of gate lines G1 to G2n, a plurality of data lines D1 to Dm/2, and n*m pixels PXs. Each of the pixels is formed at one of the intersections between the gate lines G1 to G2n and the data lines D1 to Dm/2 and displays image. The gate lines G1 to G2n are extending in the row direction, and are parallel or substantively parallel with each other. The data lines D1 to Dm/2 are extending in the column direction, and are parallel or substantively parallel with each other.

The timing controller 100 can be used to receive input image signals (such as R, G, and B) from an external graphic controller (not shown in FIG. 1) and an input control signal(s) for controlling the display of the input image signals.

In the embodiment of the present disclosure, the input control signal may specifically include a vertical sync signal Vsync, a horizontal sync signal Hsync, a master clock signal MCLK and a data enable signal DE, etc.

The timing controller 100 may also be used to generate a data control signal CONT1 based on the input image signals and the input control signals, and output the data control signal CONT1 and image data DATA to the source driving unit 300.

In addition, the timing controller 100 may further be used to provide a first clock generating control signal OE, a second clock generating control signal CPV, a frame scanning start signal STV and a stage scanning sequence control signal Frame to the clock generating unit 700.

The gray scale voltage generator 200 may be used to output a gamma reference voltage which is required by the source driving unit 300.

The source driving unit 300 may be used to provide image data voltages corresponding to the image data DATA to each of the data lines D1 to Dm/2. The data control signal CONT1 includes a horizontal start signal for initiating an operation of the source driving unit 300 and a load signal for controlling polarities and outputs of the data voltages.

The voltage generating unit 600 may be used to generate voltages required for LCD operations, such as a gate on voltage Vgon, a gate off voltage Vgoff (i.e., a power supply voltage input to the shift register), etc.

The voltage generating unit 600 provides the gate on voltage Vgon and the gate off voltage Vgoff to the clock generating unit 700, and provides the gate off voltage Vgoff to the gate driving unit 400.

The clock generating unit 700 may be used to generate a first clock signal CKV and a second clock signal CKVB based on the gate on voltage Vgon and the gate off voltage Vgoff in response to the first clock generating control signal OE, the second clock generating control signal CPV and the frame scanning start signal STV, and output the first clock signal CKV and the second clock signal CKVB.

In addition, the clock generating unit 700 may further convert the frame scanning start signal STV into a scanning start signal STVP and output the scanning start signal STVP to the gate driving unit 400. The scanning start signal STVP is a signal obtained by increasing amplitude of the frame scanning start signal STV.

The first clock signal CKV and the second clock signal CKVB switch between the gate on voltage Vgon and the gate off voltage Vgoff, and have opposite phases. Hereinafter, the first clock signal CKV and the second clock signal CKVB will be described in detail with reference to the drawings.

Figure 2:
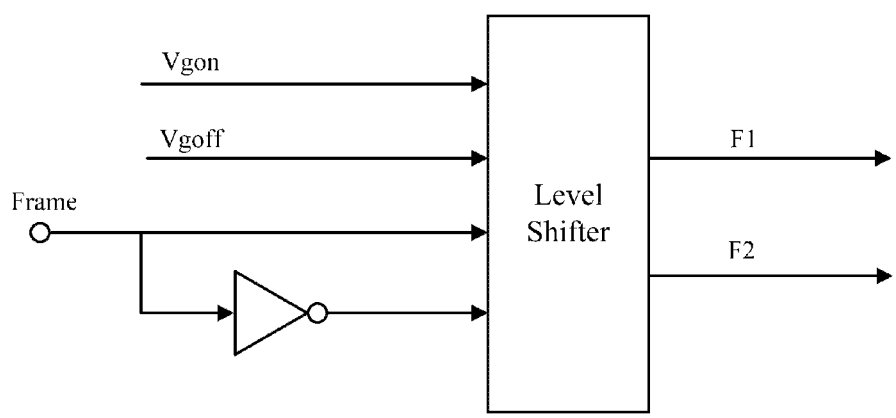
FIG. 2 is a schematic diagram illustrating a clock generating unit 700 generating a scanning sequence control signal according to an embodiment of the present disclosure.

FIG. 2 is a schematic diagram illustrating the clock generating unit 700 generating the scanning sequence control signal. Table 1 is a correspondence table of logic of the scanning sequence control signal:

TABLE 1

| Frame | F1 | F2 | Stage Scanning Sequence |
|---|---|---|---|
| H | Vgon | Vgoff | sequential scan |
| L | Vgoff | Vgon | inverse scan |

The stage scanning sequence control signal Frame and its inverted signal are provided to a lever shifter (Level Shifter) in the clock generating unit 700, and the Level Shifter generates and outputs a first scanning sequence control signal F1 and a second scanning sequence control signal F2 to the gate driving unit 400. When Frame is at a logic high level (H), F1=Vgon, F2=Vgoff, and the scanning sequence corresponding to the gate driving unit 400 can be the sequential scan; when Frame is at a logic low level (L), the first scanning sequence control signal F1=Vgoff, the second scanning sequence control signal F2=Vgon, and the scanning sequence corresponding to the gate driving unit 400 can be the inverse scan.

The gate driving unit 400 of the embodiment of the present disclosure is provided with the first clock signal CKV, the second clock signal CKVB, the scanning start signal STVP, the first scanning sequence control signal F1, the second scanning sequence control signal F2 and the gate off voltage Vgoff (as the power supply voltage of the shift register), and provides gate signals to each of the gate lines G1 to G2n.

Below the gate driving unit 400 will be described in more detail with reference to FIGS. 3 to 8. It should be noted that the gate driving unit 400 illustrated in FIGS. 3 to 8 are merely detailed embodiments of the gate driving unit 400 according to the embodiments of the present disclosure, and the embodiments of the present disclosure are not limited thereto. Any improvements and modifications that are made on the basis of the technical contents of the embodiments of the present disclosure should be within the protection scope of the invention.

The gate driving unit 400, which is related to an embodiment of the present disclosure may include at least one amorphous silicon thin film transistor (a-Si TFT).

Figure 3:
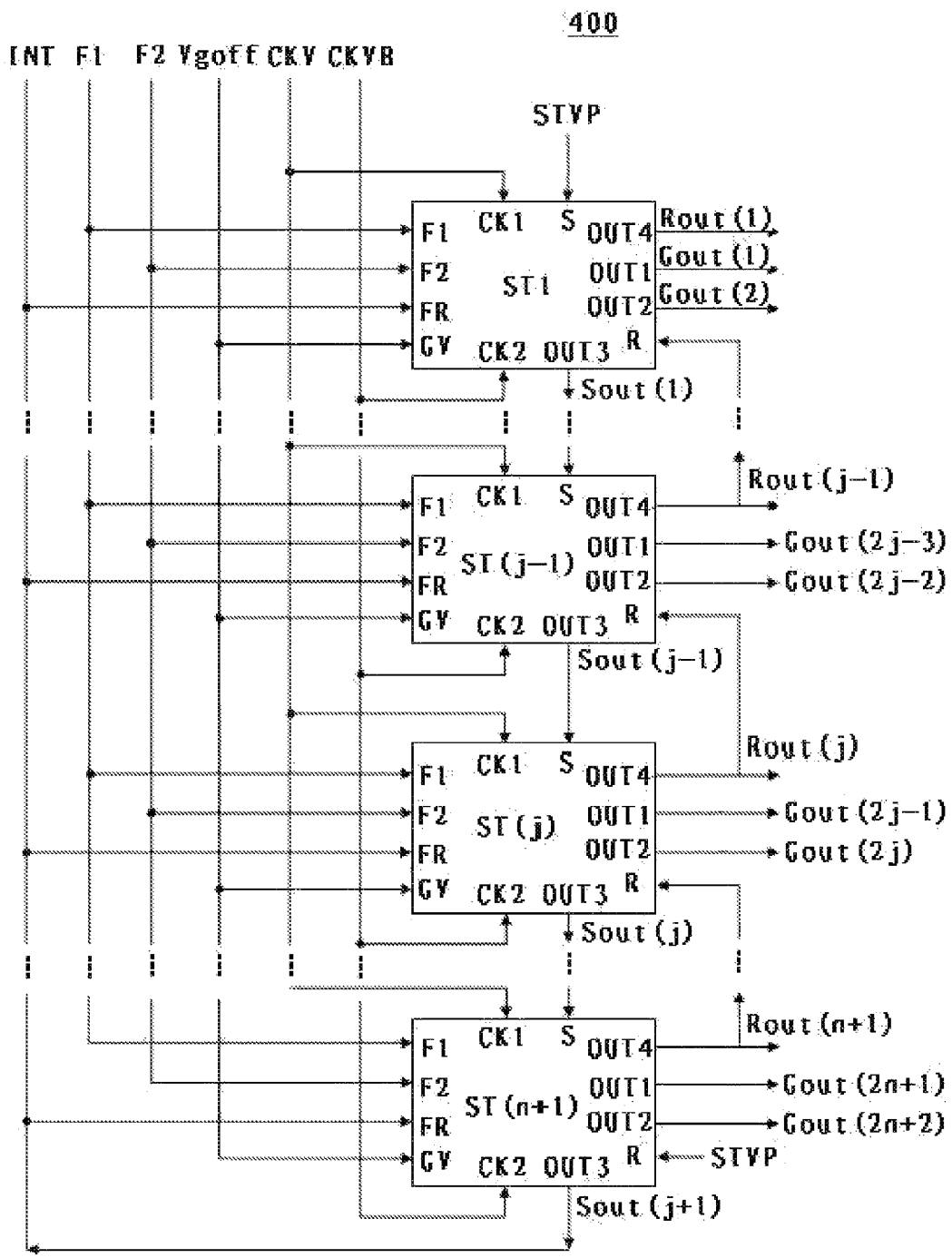
FIG. 3 is a schematic diagram illustrating a structure of a gate driving unit according to an embodiment of the present disclosure.

As illustrated in FIG. 3, the gate driving unit 400 according to the embodiment of the present disclosure may specifically include a plurality of shift registers which are connected in cascade, such as the shift registers ST(1) to ST(n+1) as shown in FIG. 3, which output a plurality of gate signals Gout(1) to Gout(2n+2), respectively, wherein each stage outputs two gate signals.

The gate off voltage Vgoff, the first clock signal CKV and the second clock signal CKVB as illustrated in FIG. 3 are input to each of the shift registers ST(1) to ST(n+1). Each stage of the shift registers ST(1) to ST(n+1), except the last stage of the shift register ST(n+1), is connected to a respective one of the gate lines (not shown) of a liquid crystal panel (not shown).

As described above, the first clock signal CKV and the second clock signal CKVB are signals switching between the gate on voltage Vgon and the gate off voltage Vgoff and having opposite phases. When the gate signals Gout(1) to Gout(2n+2) are at logic high, the first clock signal CKV or the second clock signal CKVB is output. When the gate signals Gout(1) to Gout(2n+2) are at logic low, the gate off voltage Vgoff is output. In other words, the gate signals Gout(1) to Gout(2n+2) switches between the gate on voltage Vgon and the gate off voltage Vgoff.

In the embodiment of the present disclosure, each shift register among the shift registers ST(1) to ST(n+1) includes a first clock signal input terminal CK1, a second clock signal input terminal CK2, a set signal input terminal S, a reset signal input terminal R, a power supply voltage (i.e., the gate off voltage Vgoff) input terminal GV, a frame reset signal input terminal FR, a first scanning sequence control signal input terminal F1 and a second scanning sequence control signal input terminal F2, a first gate signal output terminal OUT1, a second gate signal output terminal OUT2, a carry signal output terminal OUT3 and a reset signal output terminal OUT4.

In the embodiment of the present disclosure, the carry signal Sout(j−1) of the (j−1)th stage of the shift register ST(j−1) is input to the set signal input terminal S of the jth stage of the shift register ST(j); the reset signal Rout(j+1) of the (j+1)th stage of the shift register ST(j+1) is input to the reset signal input terminal R of the jth stage of the shift register ST(j).

Meanwhile, the first clock signal CKV and the second clock signal CKVB of the embodiment of the present disclosure are respectively input to the first clock signal input terminal CK1 and the second clock signal input terminal CK2 that are disposed in the jth stage of the shift register ST(j); the gate off voltage Vgoff is input to the power supply voltage input terminal GV of the jth stage of the shift register ST(j); and an initializing signal INT is input to the frame reset signal input terminal FR of the jth stage of the shift register ST(j); the first scanning sequence control signal F1 and the second scanning sequence control signal F2 are respectively input to the first scanning sequence control signal input terminal F1 and the second scanning sequence control signal input terminal F2 of the jth stage of the shift register ST(j). The first gate signal output terminal OUT1 and the second gate signal output terminal OUT2 of the jth stage of the shift register ST(j) output gate signals gout Gout(2j−1) and Gout(2j), respectively, the carry signal output terminal OUT3 outputs the carry signal Sout(j), and the reset signal output terminal OUT4 outputs the reset signal Rout(j).

In the embodiment of the present disclosure, the carry signal Sout(j+1) of the last stage ST(n+1) is the initializing signal INT, and is provided to each of the shift registers ST(1) to ST(n+1).

In the embodiment of the present disclosure, the first stage of the shift register ST(1) is different from other shift registers such as the second stage of the shift register ST(2) to the (n+1)th stage of the shift register ST(n+1), because the set signal input terminal S of the shift register ST(1) is provided with the scanning start signal STVP instead of the carry signal output from a previous stage of shift register; and the (n+1)th stage, i.e., the last stage of the shift register ST(n+1) is different from other shift registers such as the first stage ST(1) to the nth stage ST(n), because the reset signal input terminal R of the shift register ST(n+1) is provided with the scanning start signal STVP instead of the reset signal output from a next stage of shift register.

The jth stage of the shift register ST(j) as illustrated in FIG. 3 will be described in more detail below with reference to FIGS. 4 to 7.

Figure 4:
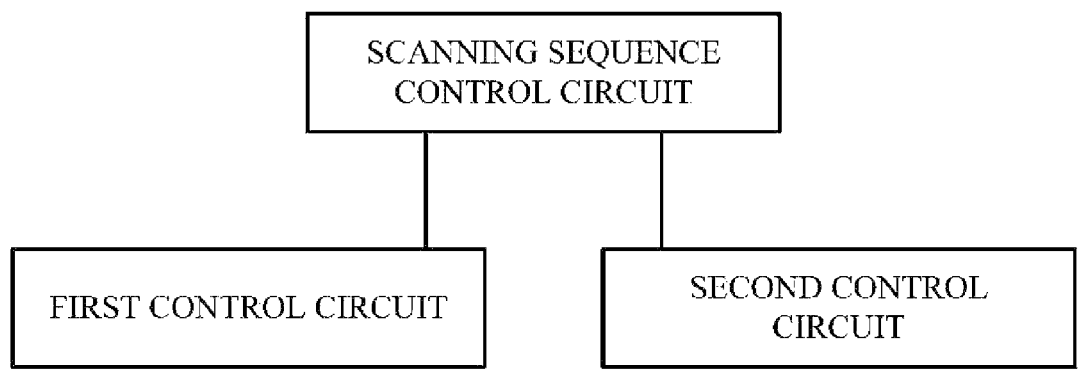
FIG. 4 is a schematic diagram illustrating a structure of a shift register according to an embodiment of the present disclosure.

A shift register unit provided by an embodiment of the present disclosure, as illustrated in FIG. 4, may specifically includes a scanning sequence control circuit ST(j)-C, a first control circuit ST(j)-A and a second control circuit ST(j)-B; wherein:

the scanning sequence control circuit ST(j)-C is a part that controls the scanning sequence, and is used to control an output sequence of the first gate signal and the second gate signal according to the received first scanning sequence control signal F1 and second scanning sequence control signal F2.

In the embodiment of the present disclosure, the first gate signal may be used to drive a first pixel in a row of pixels in the display region DA, wherein the first pixel includes at least one pixel; the second gate signal may be used to drive a second pixel in the row of pixels in the display region DA, wherein the second pixel include at least one pixel; and the pixels included in first pixel and the pixels included in the second pixel are alternately disposed.

The scanning sequence control circuit ST(j)-C is connected to the first scanning sequence control signal input terminal F1, the second scanning sequence control signal input terminal F2, the first clock signal input terminal CK1, the second clock signal input terminal CK2, the set signal input terminal S, the reset signal input terminal R, the first gate signal output terminal OUT1, the second gate signal output terminal OUT2, the carry signal output terminal OUT3 and the reset signal output terminal OUT4, respectively. Wherein, the carry signal output terminal OUT3 outputs the carry signal Sout(j) to the set signal input terminal S of the (j+1)th stage of the shift register ST(j+1), and the reset signal output terminal OUT4 outputs the reset signal Rout(j) to the reset signal input terminal R of the (j−1)th stage of the shift register ST(j−1).

The first control circuit ST(j)-A is a part for controlling the first gate signal Gout(2j−1), and may be used to output and reset the first gate signal Gout(2j−1) according to the control signals input from the scanning sequence control circuit ST(j)-C.

Specifically, the first control circuit ST(j)-A may be connected to the frame reset signal input terminal FR, the power supply voltage input terminal GV, the first gate signal output terminal OUT1 and the scanning sequence control circuit ST(j)-C, respectively.

The first control circuit ST(j)-A may specifically receive a first sub-clock signal CLKA, a second sub-clock signal CLKB, a first sub-set signal A1, a first sub-reset signal A3 input from the scanning sequence control circuit ST(j)-C, and output externally a first sub-carry signal A2 (which is input to the scanning sequence control circuit ST(j)-C) and the first gate signal Gout(2j−1).

In addition, the initializing signal INT is input from the frame reset signal input terminal FR connected to the first control circuit ST(j)-A, the gate off voltage Vgoff is input from the power supply voltage input terminal GV connected with the first control circuit ST(j)-A, and the first gate signal Gout(2j−1) is output to the first gate output terminal OUT1 connected to the first control circuit ST(j)-A.

The second control circuit ST(j)-B is a part for controlling the second gate signal Gout(2j), and may be used to output and reset the second gate signal Gout(2j) according to the control signals input from the scanning sequence control circuit ST(j)-C.

Specifically, the second control circuit ST(j)-B may be connected to the frame reset signal input terminal FR, the power supply voltage input terminal GV, the second gate signal output terminal OUT2 and the scanning sequence control circuit ST(j)-C, respectively.

The second control circuit ST(j)-B may specifically receive the first sub-clock signal CLKA, the second sub-clock signal CLKB, a second sub-set signal B1 and a second sub-reset signal B3 input from the scanning sequence control circuit ST(j)-C, and output externally a second sub-carry signal B2 (which is input to the scanning sequence control circuit ST(j)-C) and the second gate signal Gout(2j).

In addition, the initializing signal INT is input from the frame reset signal input terminal FR connected to the second control circuit ST(j)-B, the gate off voltage Vgoff is input from the power supply voltage input terminal GV connected to the second control circuit ST(j)-B, and the second gate signal Gout(2j) is output to the second gate output terminal OUT2 connected to the second control circuit ST(j)-B.

In one specific embodiment of the present disclosure, the scanning sequence control circuit ST(j)-C may specifically include:

a first control unit, which is configured to input the first sub-set signal A1, the first sub-reset signal A3 to the first control circuit ST(j)-A, and receive the first sub-carry signal A2 input from the first control circuit ST(j)-A.

Specifically, the first control unit may be connected to the first control circuit ST(j)-A, the second control circuit ST(j)-B, the first scanning sequence control signal input terminal F1, the set signal input terminal S, the reset signal input terminal R, the first gate signal output terminal OUT1, the carry signal output terminal OUT3, the reset signal output terminal OUT4, etc., respectively.

In another specific embodiment of the present disclosure, the scanning sequence control circuit ST(j)-C may further include:

a second control unit, which is configured to input the second sub-set signal B1 and the second sub-reset signal B3 to the second control circuit ST(j)-B and receive the second sub-carry signal B2 input from the second control circuit ST(j)-B.

Specifically, the second control unit may be connected to the second control circuit ST(j)-B, the first control circuit ST(j)-A, the second scanning sequence control signal input terminal F2, the set signal input terminal S, the reset signal input terminal R, the second gate signal output terminal OUT2, the carry signal output terminal OUT3, the reset signal output terminal OUT4, etc., respectively.

In yet another specific embodiment of the present disclosure, the scanning sequence control circuit ST(j)-C may further include:

a clock signal control unit, which is configured to input the first clock sub signal CLKA and the second clock sub signal CLKB to the first control circuit ST(j)-A or the second control circuit ST(j)-B.

The clock signal control unit may be specifically connected to the first scanning sequence control signal input terminal F1, the second scanning sequence control signal input terminal F2, the first clock signal input terminal CK1 and the second clock signal input terminal CK2, respectively.

Figure 5:
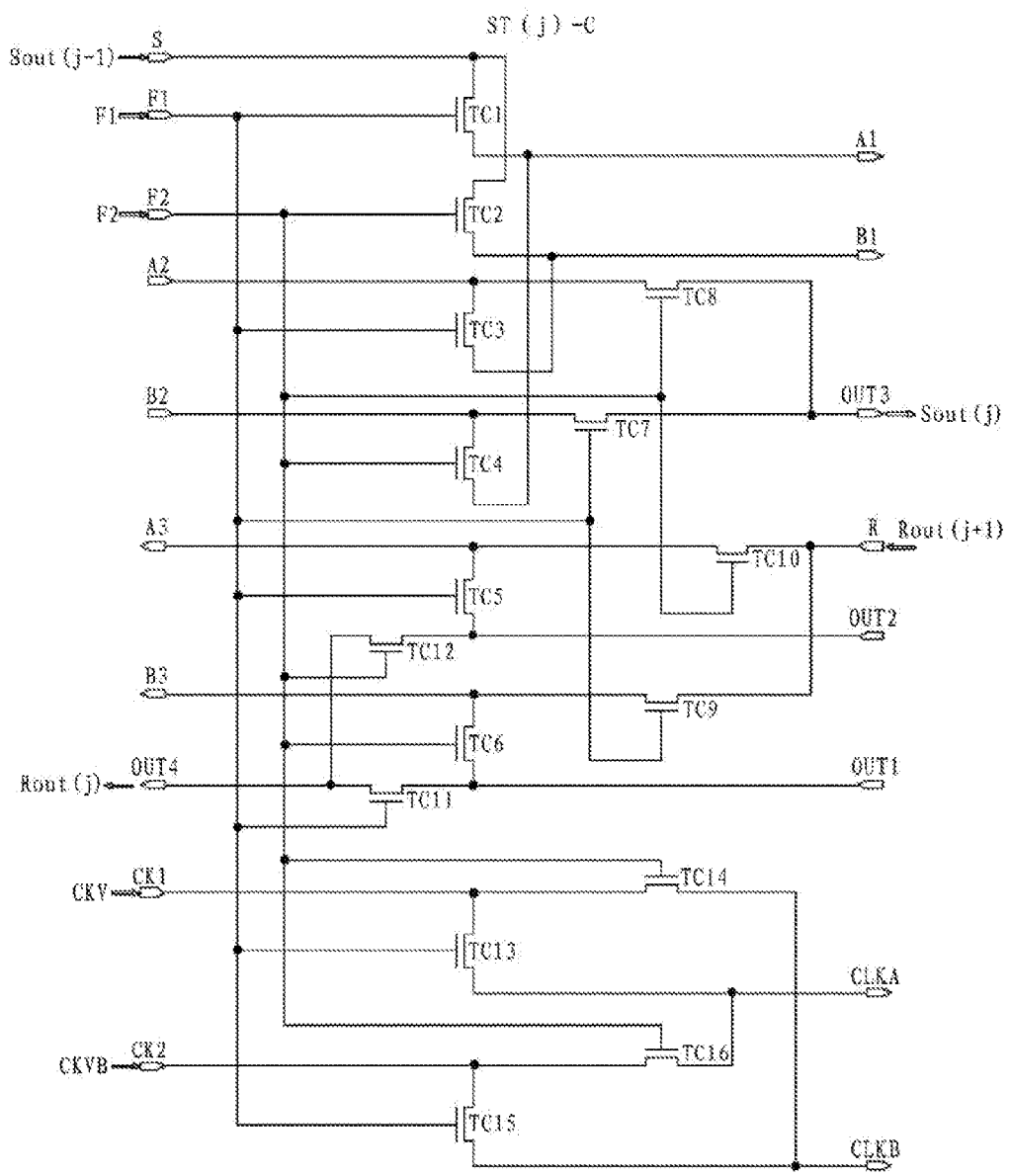
FIG. 5 is a schematic diagram illustrating a first structure of a scanning sequence control circuit ST(j)-C according to an embodiment of the present disclosure.

In one specific embodiment of the present disclosure, a detailed circuit structure of the scanning sequence control circuit ST(j)-C may be as shown in FIG. 5, in which:

the first control unit may specifically include:

a first transistor TC1, a third transistor TC3, a fifth transistor TC5, a seventh transistor TC7, a ninth transistor TC9 and an eleventh transistor TC11, wherein:

a source of the first transistor TC1 is connected to the set signal input terminal S, a gate of the first transistor TC1 is connected to the first scanning sequence control signal input terminal F1, a drain of the first transistor TC1 is connected to the first control circuit ST(j)-A (in more detail, can be used to input the first sub-set signal A1 to the first control circuit ST(j)-A);

a source of the third transistor TC3 is connected to the first control circuit (in more detail, may be used to receive the first carry signal A2 input from the first control circuit), a gate of the third transistor TC3 is connected to the first scanning sequence control signal input terminal F1, a drain of the third transistor TC3 is connected to the second control circuit ST(j)-B (in more detail, may be used to input the second sub-set signal B1 to the second control circuit ST(j)-B);

a source of the fifth transistor TC5 is connected to the second gate signal output terminal OUT2, a gate of the fifth transistor TC5 is connected to the first scanning sequence control signal input terminal F1, a drain of the fifth transistor TC5 is connected to the first control circuit ST(j)-A (in more detail, may be used to input the first sub-reset signal A3 to the first control circuit ST(j)-A);

a source of the seventh transistor TC7 is connected to the second control circuit ST(j)-B (in more detail, may be used to receive the second sub-set signal B2 input from second control circuit ST(j)-B), a gate of seventh transistor TC7 is connected to the first scanning sequence control signal input terminal F1, a drain of the seventh transistor TC7 is connected to the carry signal output terminal OUT3;

a source of the ninth transistor TC9 is connected to the reset signal input terminal R, a gate of the ninth transistor TC9 is connected to the first scanning sequence control signal input terminal F1, a drain of the ninth transistor TC9 is connected to the second control circuit ST(j)-B (in more detail, may be used to input the second sub-reset signal B3 to the second control circuit ST(j)-B);

a source of the eleventh transistor TC11 is connected to the first gate signal output terminal OUT1, a gate of the eleventh transistor TC11 is connected to the first scanning sequence control signal input terminal F1, and a drain of the eleventh transistor TC11 is connected to the reset signal output terminal OUT4.

In an example, the second control unit may be specifically include:

a second transistor TC2, a fourth transistor TC4, a sixth transistor TC6, a eighth transistor TC8, a tenth transistor TC10, and a twelfth transistor TC12, wherein:

a source of the second transistor TC2 is connected to the set signal input terminal S, a gate of the second transistor TC2 is connected to the second scanning sequence control signal input terminal F2, a drain of the second transistor TC2 is connected to the second control circuit ST(j)-B (in more detail, may be used to input the second sub-set signal B1 to the second control circuit ST(j)-B);

a source of the fourth transistor TC4 is connected to the second control circuit ST(j)-B (in more detail, may be used to receive the second sub-carry signal B2 input from the second control circuit ST(j)-B), a gate of the fourth transistor TC4 is connected to the second scanning sequence control signal input terminal F2, a drain of the fourth transistor TC4 is connected to the first control circuit ST(j)-A (in more detail, may be used to input the first sub-set signal A1 to the first control circuit ST(j)-A);

a source of the sixth transistor TC6 is connected to the first gate signal output terminal OUT1, a gate of the sixth transistor TC6 is connected to the second scanning sequence control signal input terminal F2, a drain of the sixth transistor TC6 is connected to the second control circuit ST(j)-B (in more detail, may be used to input the second sub-reset signal B3 to the second control circuit ST(j)-B);

a source of the eighth transistor TC8 is connected to the first control circuit ST(j)-A (in more detail, may be used to receive the first carry signal A2 input from the first control circuit), a gate of the eighth transistor TC8 is connected to the second scanning sequence control signal input terminal F2, a drain of the eighth transistor TC8 is connected to the carry signal output terminal OUT3;

a source of the tenth transistor TC10 is connected to the reset signal input terminal R, a gate of the tenth transistor TC10 is connected to the second scanning sequence control signal input terminal F2, a drain of the tenth transistor TC10 is connected to the first control circuit ST(j)-A (in more detail, may be used to input the first sub-reset signal A3 to the first control circuit ST(j)-A);

a source of the twelfth transistor TC12 is connected to the second gate signal output terminal OUT2, a gate of the twelfth transistor TC12 is connected to the second scanning sequence control signal input terminal F2, and a drain of the twelfth transistor TC12 is connected to the reset signal output terminal OUT4.

In an example, the clock signal control unit may be specifically include:

a thirteenth transistor TC13, a fourteenth transistor TC14, a fifteenth transistor TC15, and a sixteenth transistor TC16, wherein:

a source of the thirteenth transistor TC13 is connected to the first clock signal output terminal CK1, a gate of the thirteenth transistor TC13 is connected to the first scanning sequence control signal input terminal F1, and a drain of the thirteenth transistor TC13 is connected to the first control circuit ST(j)-A and the second control circuit ST(j)-B;

a source of the fourteenth transistor TC14 is connected to the first clock signal output terminal CK1, a gate of the fourteenth transistor TC14 is connected to the second scanning sequence control signal input terminal F2, and a drain of the fourteenth transistor TC14 is connected to the first control circuit ST(j)-A and the second control circuit ST(j)-B;

a source of the fifteenth transistor TC15 is connected to the second clock signal output terminal CK2, a gate of the fifteenth transistor TC15 is connected to the first scanning sequence control signal input terminal F1, and a drain of the fifteenth transistor TC15 is connected to the first control circuit ST(j)-A and the second control circuit ST(j)-B;

a source of the sixteenth transistor TC16 is connected to the second clock signal output terminal CK2, a gate of the sixteenth transistor TC16 is connected to the second scanning sequence control signal input terminal F2, and a drain of the sixteenth transistor TC16 is connected to the first control circuit ST(j)-A and the second control circuit ST(j)-B.

In the embodiment of the present disclosure, the circuit structures of the first control circuit ST(j)-A and the second control circuit ST(j)-B are not limited thereto, and both of the first control circuit ST(j)-A and the second control circuit ST(j)-B may employ the same circuit structures, or they may employ different circuit structures.

Below a specific embodiment of the first control circuit ST(j)-A and the second control circuit ST(j)-B will be described so that the technical solutions of the embodiments of the present disclosure can be easily understood. It should be noted that the embodiment is merely for the purpose of illustration, and is not intended to indicate that the described are the only circuit structures of the first control circuit ST(j)-A and the second control circuit ST(j)-B according to the embodiments of the present disclosure.

Figure 6:
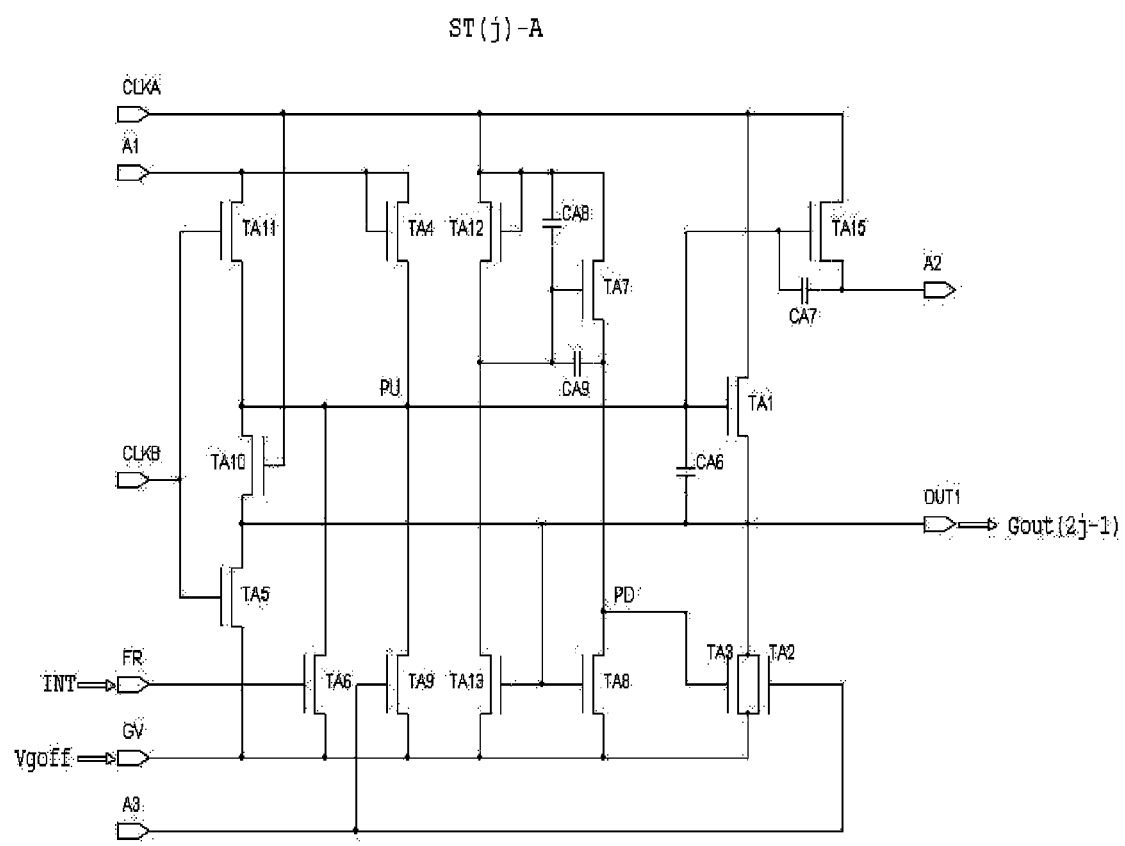
FIG. 6 is a schematic diagram illustrating a structure of a first control circuit ST(j)-A according to an embodiment of the present disclosure.
Figure 7:
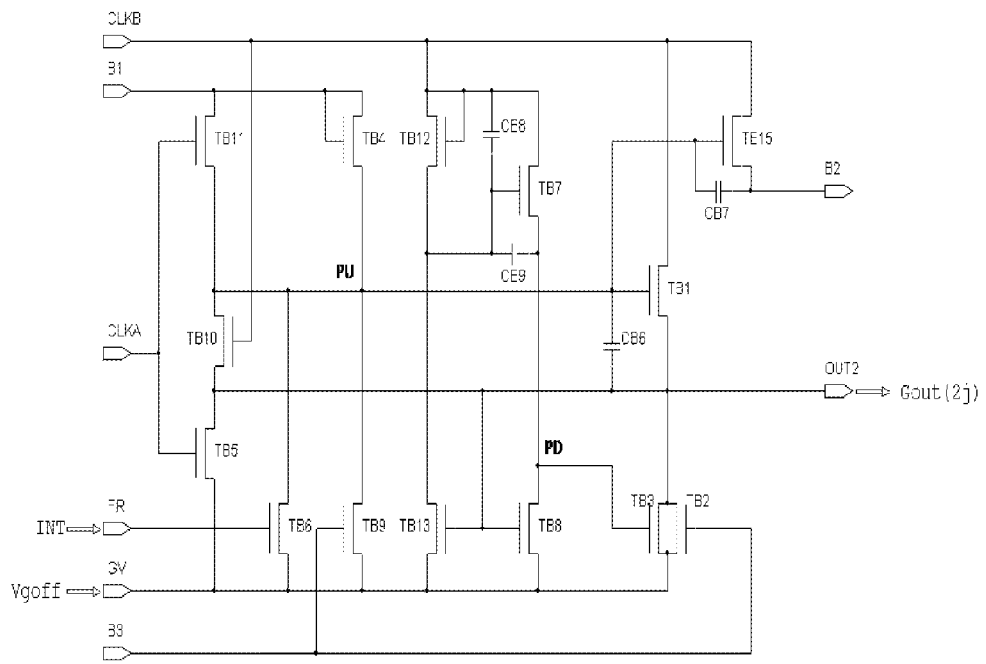
FIG. 7 is a schematic diagram illustrating a structure of a second control circuit ST(j)-B according to an embodiment of the present disclosure.

In the embodiment, as shown in FIG. 6 (the first control circuit ST(j)-A) and FIG. 7 (the second control circuit ST(j)-B), the first control circuit ST(j)-A and the second control circuit ST(j)-B have the same circuit structures, except that their connections with the scanning sequence control circuit ST(j)-C are different. Hereinafter, the first control circuit ST(j)-A will be described in detail as an example.

As shown in FIG. 6, the first control circuit ST(j)-A may be specifically include: a buffering unit, a charging unit, a pulling-up unit, a carry signal generating unit, a pulling-down unit, a discharging unit and a holding unit, wherein:

the buffering unit may specifically include a transistor TA4, and a source and a gate of the transistor TA4 are connected to the drains of the first transistor TC1 and the fourth transistor TC4 in the scanning sequence control circuit ST(j)-C, for receiving the first sub-set signal A1 input from the scanning sequence control circuit ST(j)-C, and a drain of the transistor TA4 is connected to a pulling-up node.

The charging unit may specifically include a capacitor CA6, and a first terminal of the capacitor CA6 is connected to the pulling-up node PU, and a second terminal of the capacitor CA6 is connected to the first gate signal output terminal OUT1. In more detail, the charging unit may be charged in response to the first sub-set signal A1.

The pulling-up unit may specifically include a transistor TA1. A source of the transistor TA1 is connected to the drains of the thirteenth transistor TC13 and the sixteenth transistor TC16 in the scanning sequence control circuit ST(j)-C, for receiving the first sub-clock signal CLKA input from the scanning sequence control circuit ST(j)-C, a gate of the transistor TA1 is connected to the first terminal of the capacitor CA6, and a drain of the transistor TA1 is connected to the first gate signal output terminal OUT1.

The carry signal generating unit may specifically include a transistor TA15 and a capacitor CA7, wherein a source of the transistor TA15 is also for receiving the first sub-clock signal CLKA input from the scanning sequence control circuit ST(j)-C, i.e., the source of the transistor TA15 is connected to the drains of the thirteenth transistor TC13 and the sixteenth transistor TC16 in the scanning sequence control circuit ST(j)-C, respectively, a gate of the transistor TA15 is connected to a first terminal of the capacitor CA7 and the pull-up node PU, respectively, and a drain of the transistor TA15 is connected to a second terminal of the capacitor CA7, the sources of the third transistor TC3 and the eighth transistor TC8 in the scanning sequence control circuit ST(j)-C, for inputting the first sub-carry signal A2 to the scanning sequence control circuit ST(j)-C.

The pulling-down unit may specifically include a transistor TA2 and a transistor TA9. Wherein, a source of the transistor TA2 is connected to the first gate signal output terminal OUT1, a gate of the transistor TA2 is connected to drains of the fifth transistor TC5 and the tenth transistor TC10 in the scanning sequence control circuit ST(j)-C, for receiving the first sub-reset signal A3 input from the scanning sequence control circuit ST(j)-C, and a drain of the transistor TA2 is connected to the power supply voltage input terminal GV. A source of the transistor TA9 is connected to the pulling-up node; a gate of the transistor TA9 is connected to drains of the fifth transistor TC5 and the tenth transistor TC10 in the scanning sequence control circuit ST(j)-C, for receiving the first sub-reset signal A3 input from the scanning sequence control circuit ST(j)-C; and a drain of the transistor TA9 is connected to the power supply voltage input terminal GV.

The discharge unit may include specifically include a transistor TA6. A source of the transistor TA6 is connected to the pulling-up node PU, a gate of the transistor TA6 is connected to the frame reset signal input terminal FR, and a drain of the transistor TA6 is connected to the power supply voltage input terminal GV. The discharging unit discharges the pulling-up node PU to the gate off voltage Vgoff in response to the frame reset signal and the first sub-reset signal.

The holding unit may specifically include a transistor TA3, a transistor TA5, a transistor TA7, a transistor TAB, a transistor TA10, a transistor TA11, a transistor TA12, a transistor TA13 and a capacitor CA8, a capacitor CA9. A source of the transistor TA11 is connected to drain of the first transistor TC1 and the fourth transistor TC4 in the scanning sequence control circuit ST(j)-C, respectively, for receiving the first sub-set signal A1 input from the scanning sequence control circuit ST(j)-C; gates of the transistors TA11 and TA5 are connected to drains of the fourteenth transistor TC14 and the fifteenth transistor TC15 in the scanning sequence control circuit ST(j)-C, for receiving the second sub-clock signal input from the scanning sequence control circuit ST(j)-C; a drain of the transistor TA11 and a source of the transistor TA10 are commonly connected to the pulling-up node PU; a gate of the transistor TA10, a source and a gate of the transistor TA12, a first terminal of the capacitor CA8, and a source of the transistor TA7 are commonly connected to drains of the thirteenth transistor TC13 and the sixteenth transistor TC16 in the scanning sequence control circuit ST(j)-C, for receiving the first sub-clock signal CLKA input from the scanning sequence control circuit ST(j)-C; a drain of the transistor TA10, a source of the transistor TA5, a gate of the transistor TA13, a gate of the transistor TA8, a source of the transistor TA3 are commonly connected to the second terminal of the capacitor CA6 and the first gate signal output terminal OUT1; drains of the transistors TA5, TA13, TA8, and TA3 are commonly connected to the power supply voltage input terminal GV; a drain of the transistor TA12 is connected to a gate of the transistor TA7, a source of the transistor TA13, a second terminal of the capacitor CA8, and a first terminal of the capacitor CA9, respectively; and a drain of the transistor TA7, a second terminal of the capacitor CA9, a source of the transistor TA8, and a gate of the transistor TA3 are connected to the pulling-down node PD.

Functions and utilities of the respective functional units of the above-described first control circuit ST(j)-A may be the same as those in the prior art, thus detailed descriptions thereof are omitted here.

In addition, it is apparent by referring to and contrasting FIGS. 6 and 7, the constituent circuit structure of the second control circuit ST(j)-B may be exactly as same as that of the first control circuit ST(j)-A, except that the connection relationship between the circuit in the second control circuit ST(j)-B and circuit in the scanning sequence control circuit ST(j)-C is different. For more details please refer to FIGS. 6 and 7, and detailed descriptions thereof are omitted here.

Thus, according to the circuit connection relationships related to the shift registers according to the embodiments of the present disclosure, when Frame is at a logic high level (H), F1=Vgon, F2=Vgoff, the transistors TC1, TC3, TC5, TC7, TC9, TC11, TC13 and TC15 in the scanning sequence control circuit ST(j)-C are turned on, and the transistors TC2, TC4, TC6, TC8, TC10, TC12, TC14 and TC16 are turned off, and signal transmission relationships are shown in Table 2:

TABLE 2

| | | |
|---|---|---|
| Sout(j−1) | → | A1 |
| A2 | → | B1 |
| B2 | → | Sout(j) |
| Gout(2j−1) | → | Rout(j) |
| Gout(2j) | → | A3 |
| Rout(j+1) | → | B3 |
| CKV | → | CLKA |
| CKVB | → | CLKB |

The above-described signal transmission relationships cause that, in the jth stage of the shift register ST(j), the first gate signal Gout(2j−1) in the first control circuit ST(j)-A is output at first, and then the second gate signal Gout(2j) in the second control circuit ST(j)-B is output, thus the corresponding scanning sequence is the sequential scan.

When Frame is at a logic low level (L), F1=Vgoff, F2=Vgon, the transistors TC1, TC3, TC5, TC7, TC9, TC11, TC13 and TC15 in the scanning sequence control circuit ST(j)-C are turned off, and the transistors TC2, TC4, TC6, TC8, TC10, TC12, TC14 and TC16 are turned on, and the signal transmission relationships are shown in Table 3:

TABLE 3

| | | |
|---|---|---|
| Sout(j−1) | → | B1 |
| B2 | → | A1 |
| A2 | → | Sout(j) |
| Gout(2j) | → | Rout(j) |
| Gout(2j−1) | → | B3 |
| Rout(j+1) | → | A3 |
| CKV | → | CLKB |
| CKVB | → | CLKA |

The above-described signal transmission relationships cause that, in the jth stage of the shift register ST(j), the second gate signal Gout(2j) in the second control circuit ST(j)-B is output at first, and then the first gate signal Gout(2j−1) in the first control circuit ST(j)-A is output, thus the corresponding scanning sequence is the inverse scan.

Figure 8:
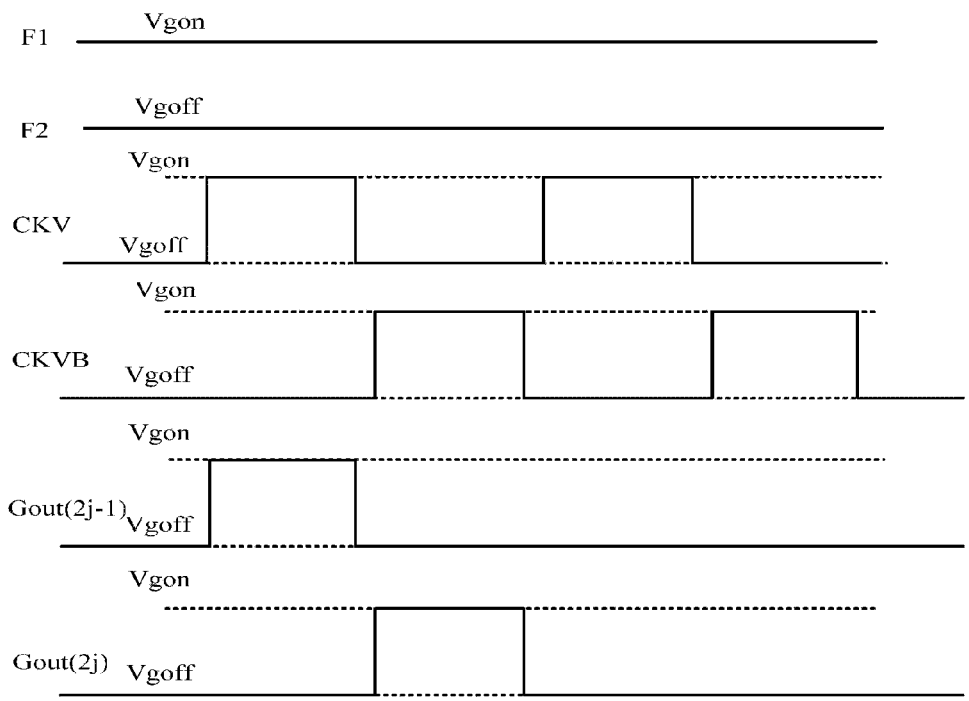
FIG. 8 is a first timing diagram illustrating signals of a gate driving unit according to an embodiment of the present disclosure.
Figure 9:
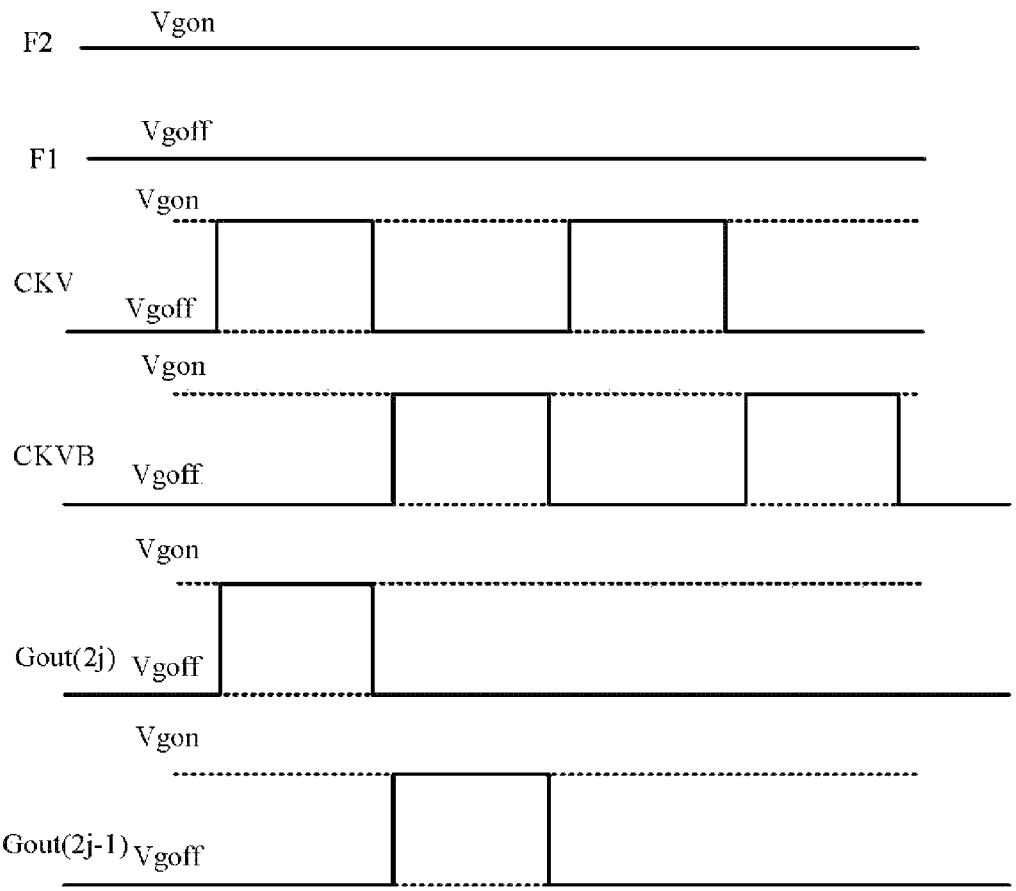
FIG. 9 is a second timing diagram illustrating signals of a gate driving unit according to an embodiment of the present disclosure.

The signal timings in the above-described two situations, i.e., the sequential scan and the inverse scan of the jth stage of the shift register ST(j), are shown in FIGS. 8 and 9.

Figure 10:
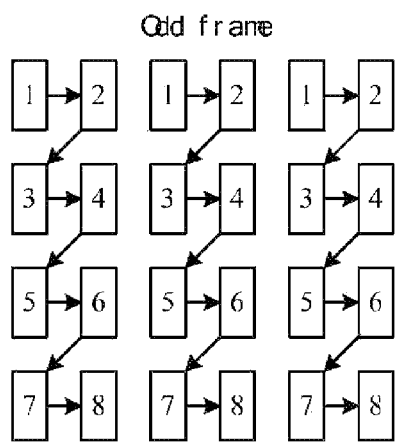
FIG. 10 is a schematic diagram illustrating a sequential scanning implemented by a gate driving unit according to an embodiment of the present disclosure.
Figure 11:
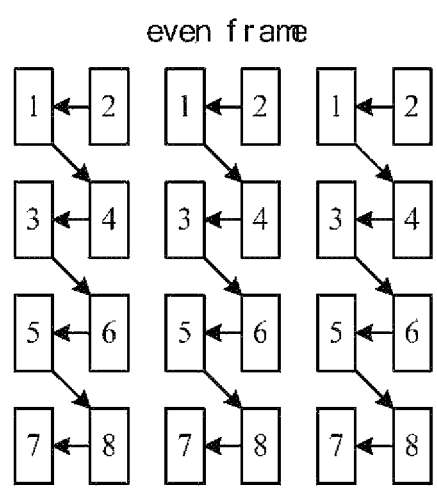
FIG. 11 is a schematic diagram illustrating a reverse scanning implemented by a gate driving unit according to an embodiment of the present disclosure.

Below reference will be made to FIGS. 10 and 11 so as to describe that the Vertical mura problem can be resolved and the image quality can be improved by setting the scanning sequence of each stage in the period unit of frame.

In the LCD device that employs the Dual gate technical, the pixels are arranged in the DA by n rows and m columns, and the DA include a plurality of gate lines G1 to G2n, a plurality of data lines D1 to Dm/2 and n*m pixels PXs, in which each pixel is formed at one of the intersections between the gate lines G1 to G2n and the data lines D1 to Dm/2, and for displaying images. The first gate signal Gout(2j−1) in the first control circuit ST(j)-A is output to the gate line G(2j−1), and the second gate signal Gout(2j) in the second control circuit ST(j)-B is output to the gate line G(2j).

For the pixels in the jth row, the image displaying is controlled by the gate line G(2j−1) and the gate line G(2j), in which the gate line G(2j−1) controls the displaying of the odd-numbered pixels among the m pixels in the jth row, such as 1, 3, 5, . . . , and the gate line G(2j) controls the displaying of the even-numbered pixels among the m pixels in the jth row, such as 2, 4, 6, . . . . In FIG. 11, the odd-numbered pixels in the first row are denoted with "1", indicating that the displaying thereof are controlled by the gate line G1, and the odd-numbered pixels in the second row are denoted with "3", indicating that the displaying thereof is controlled by the gate line G3, and so on.

According to the conventional design of the GIP driving, each stage of the shift registers ST(1) to ST(n+1) is subject to a same scan sequence, no matter whether it is an odd frame (Odd frame) or an even frame (Even frame), as shown in the below Table 4. Thus, in the case that changes in polarities of the data line voltages are ++ −− ++ −−, the odd-numbered pixels may be insufficiently charged while the even-numbered pixels may be sufficiently charged, resulting in the brightness of the odd-numbered pixels and the even-numbered pixels are not uniform, and accordingly the Vertical mura problem occurs.

TABLE 4

| | | |
|---|---|---|
| Odd frame | G1→G2→G3→G4→G5→G6→G7→G8 | Sequential Scan |
| Even frame | G1→G2→G3→G4→G5→G6→G7→G8 | Sequential Scan |

However, according to the GIP driving design provided by the embodiments of the present disclosure, each stage of the shift registers ST(1) to ST(n+1) is set as the sequential scan in the case of the Odd frame, and each stage of the shift registers ST(1) to ST(n+1) are set as the inverse scan in the case of the Even frame, as shown in the below Table 5. Thus the odd-numbered pixels are insufficiently charged while the even-numbered pixels are sufficiently charged in the case of the Odd frame, and the odd-numbered pixels are sufficiently charged while the even-numbered pixels are insufficiently charged in the case of the Even frame. Therefore the brightness of the odd-numbered pixels and the even-numbered pixels may be consistent as the time goes by, and accordingly the Vertical mura problem may be resolved and the image quality can be improved.

TABLE 5

| | | |
|---|---|---|
| Odd frame | G1→G2→G3→G4→G5→G6→G7→G8 | Sequential Scan |
| Even frame | G2→G1→G4→G3→G6→G5→G8→G7 | Inverse Scan |

Specifically, the display device provided by the embodiments of the present disclosure can be a display device such as a liquid crystal panel, a liquid crystal television, a liquid crystal display, an OLED panel, an OLED display, a plasma display or a electronic paper, etc.

It can be seen from the above description that the shift register, the gate driving unit and the display device provided by the embodiments of the present disclosure dispose a scanning sequence control circuit, a first control circuit and a second control circuit in the shift register unit, wherein the scanning sequence control circuit is configured to control the output sequence of the first gate signal and the second gate signal according to the received first scanning sequence control signal and second scanning sequence control signal, the first gate signal is used to drive a first pixel among a row of pixels in the display region with the first pixel including at least one pixel, the second gate signal is used to drive a second pixel among the row of pixels in the display region with the second pixel including at least one pixel, and the pixels included in the first pixel and the pixels included in the second pixel are alternately disposed. Thus, it is possible to set the scanning sequence of the gate driving unit, and accordingly the Vertical mura problem in the prior art can be resolved and the image quality of the display device can be improved.

The shift register, the gate driving unit and the display device provided by the embodiments of the present disclosure are particularly suitable to the GOA circuit requirements under a manufacture process of low temperature polycrystalline silicon (LTPS) technology, and can also be applied to the GOA circuits under the amorphous silicon process.

Described above are the merely embodiments of the present disclosure. It should be noted that those ordinary skilled in the related art may improve and modify the embodiments of the present disclosure without departing from the principle of the invention, and those improvements and modifications are intended to be within the protection scope of the invention.

What is claimed is:

1. A shift register unit comprising a scanning sequence control circuit, a first control circuit and a second control circuit, wherein:

the scanning sequence control circuit is connected to a first scanning sequence control signal input terminal, a second scanning sequence control signal input terminal, a first clock signal input terminal, a second clock signal input terminal, a set signal input terminal, a reset signal input terminal, a first gate signal output terminal, a second gate signal output terminal, a carry signal output terminal, and a reset signal output terminal, respectively, and the scanning sequence control circuit is configured to control output sequence of a first gate signal and a second gate signal only according to the received first scanning sequence control signal and second scanning sequence control signal;

the first control circuit is configured to output and reset the first gate signal according to the control signals input from the scanning sequence control circuit, and the first control circuit is connected to a frame reset signal input terminal, a power supply voltage input terminal, the first gate signal output terminal and the scanning sequence control circuit, respectively;

the second control circuit is configured to output and reset the second gate signal according to the control signals input from the scanning sequence control circuit, and the second control circuit is connected to the frame reset signal input terminal, the power supply voltage input terminal, the second gate signal output terminal and the scanning sequence control circuit, respectively, wherein the scanning sequence control circuit comprises:

a first control unit, configured to input a first sub-set signal and a first sub-reset signal to the first control circuit, and receive a first sub-carry signal input from the first control circuit, wherein the first control unit is connected to the first scanning sequence control signal input terminal, the set signal input terminal, the reset signal input terminal, the first gate signal output terminal, the carry signal output terminal and the reset signal output terminal, respectively;

a second control unit, configured to input a second sub-set signal and a second sub-reset signal to the second control circuit, and receive a second sub-carry signal input from the second control circuit, wherein the second control unit is connected to the second scanning sequence control signal input terminal, the set signal input terminal, the reset signal input terminal, the second gate signal output terminal, the carry signal input terminal and the reset signal output terminal, respectively;

a clock signal control unit, configured to input a first clock sub-signal and a second clock sub-signal to the first control circuit or the second control circuit, wherein the clock signal control unit is connected to the first scanning sequence control signal input terminal, the second scanning sequence control signal input terminal, the first clock signal input terminal and the second clock signal input terminal, respectively.

2. The shift register unit of claim 1, wherein, the first control unit comprises:

a first transistor TC1, a third transistor TC3, a fifth transistor TC5, a seventh transistor TC7, a ninth transistor TC9 and a eleventh transistor TC11, wherein:

a source of the first transistor TC1 is connected to the set signal input terminal, a gate of the first transistor TC1 is connected to the first scanning sequence control signal input terminal, and the drain of the first transistor TC1 is connected to the first control circuit;

a source of the third transistor TC3 is connected to the first control circuit, a gate of the third transistor TC3 is connected to the first scanning sequence control signal input terminal, and a drain of the third transistor TC3 is connected to the second control circuit;

a source of the fifth transistor TC5 is connected to the second gate signal output terminal, a gate of the fifth transistor TC5 is connected to the first scanning sequence control signal input terminal, and a drain of the fifth transistor TC5 is connected to the first control circuit;

a source of the seventh transistor TC7 is connected to the second control circuit, a gate of the seventh transistor TC7 is connected to the first scanning sequence control signal input terminal, a drain of the seventh transistor TC7 is connected to the carry signal output terminal;

a source of the ninth transistor TC9 is connected to the reset signal input terminal, a gate of the ninth transistor TC9 is connected to the first scanning sequence control signal input terminal, and a drain of the ninth transistor TC9 is connected to the second control circuit;

a source of the eleventh transistor TC11 is connected to the first gate signal output terminal, a gate of the eleventh transistor TC11 is connected to the first scanning sequence control signal input terminal, and a drain of the eleventh transistor TC11 is connected to the reset signal output terminal.

3. The shift register unit of claim 2, wherein the second control unit comprises:
- a second transistor TC2, a fourth transistor TC4, a sixth transistor TC6, a eighth transistor TC8, a tenth transistor TC10, and a twelfth transistor TC12, wherein:
- a source of the second transistor TC2 is connected to the set signal input terminal, a gate of the second transistor TC2 is connected to the second scanning sequence control signal input terminal, and a drain of the second transistor TC2 is connected to the second control circuit;
- a source of the fourth transistor TC4 is connected to the second control circuit, a gate of the fourth transistor TC4 is connected to the second scanning sequence control signal input terminal, and a drain of the fourth transistor TC4 is connected to the first control circuit;
- a source of the sixth transistor TC6 is connected to the first gate signal output terminal, a gate of the sixth transistor TC6 is connected to the second scanning sequence control signal input terminal, and a drain of the sixth transistor TC6 is connected to the second control circuit;
- a source of the eighth transistor TC8 is connected to the first control circuit, a gate of the eighth transistor TC8 is connected to the second scanning sequence control signal input terminal, and a drain of the eighth transistor TC8 is connected to the carry signal output terminal;
- a source of the tenth transistor TC10 is connected to the reset signal input terminal, a gate of the tenth transistor TC10 is connected to the second scanning sequence control signal input terminal, and a drain of the tenth transistor TC10 is connected to the first control circuit;
- a source of the twelfth transistor TC12 is connected to the second gate signal output terminal, a gate of the twelfth transistor TC12 is connected to the second scanning sequence control signal input terminal, and a drain of the twelfth transistor TC12 is connected to the reset signal output terminal.

4. The shift register unit of claim 3, wherein the clock signal control unit comprises:
- a thirteenth transistor TC13, a fourteenth transistor TC14, a fifteenth transistor TC15, and a sixteenth transistor TC16, wherein:
- a source of the thirteenth transistor TC13 is connected to the first clock signal input terminal, a gate of the thirteenth transistor TC13 is connected to the first scanning sequence control signal input terminal, and a drain of the thirteenth transistor TC13 is connected to the first control circuit and the second control circuit;
- a source of the fourteenth transistor TC14 is connected to the first clock signal input terminal, a gate of the fourteenth transistor TC14 is connected to the second scanning sequence control signal input terminal, and a drain of the fourteenth transistor TC14 is connected to the first control circuit and the second control circuit;
- a source of the fifteenth transistor TC15 is connected to the second clock signal input terminal, a gate of the fifteenth transistor TC15 is connected to the first scanning sequence control signal input terminal, and a drain of the fifteenth transistor TC15 is connected to the first control circuit and the second control circuit;
- a source of the sixteenth transistor TC16 is connected to the second clock signal input terminal, a gate of the sixteenth transistor TC16 is connected to the second scanning sequence control signal input terminal, and a drain of the sixteenth transistor TC16 is connected to the first control circuit and the second control circuit.

5. The shift register of claim 4, wherein the first control circuit comprises a buffering unit, a charging unit, a pulling-up unit, a carry signal generating unit, a pulling-down unit, a discharging unit and a holding unit, wherein:
- the buffering unit comprises a transistor TA4, and a source and a gate of the transistor TA4 are coupled to the drain of the first transistor TC1 and the drain of the fourth transistor TC4 in the scanning sequence control circuit, and a drain of the transistor TA4 is connected to a pulling-up node;
- the charging unit comprises a capacitor CA6, and a first terminal of the capacitor CA6 is connected to the pulling-up node, and a second terminal of the capacitor CA6 is connected to the first gate signal output terminal;
- the pulling-up unit comprises a transistor TA1, and a source of the transistor TA1 is connected to the drains of the thirteenth transistor TC13 and the sixteenth transistor TC16 in the scanning sequence control circuit, a gate of the transistor TA1 is connected to the first terminal of the capacitor CA6, and a drain of the transistor TA1 is connected to the first gate signal output terminal;
- the carry signal generating unit comprises a transistor TA15 and a capacitor CA7, wherein a source of the transistor TA15 is connected to the drains of the thirteenth transistor TC13 and the sixteenth transistor TC16 in the scanning sequence control circuit, respectively, a gate of the transistor TA15 is connected to a first terminal of the capacitor CA7 and the pulling-up node PU, respectively, and a drain of the transistor TA15 is connected to a second terminal of the capacitor CA7, the sources of the third transistor TC3 and the eighth transistor TC8 in the scanning sequence control circuit; respectively;
- the pulling-down unit comprises a transistor TA2 and a transistor TA9, wherein a source of the transistor TA2 is connected to the first gate signal output terminal, a source of the transistor TA9 is connected to the pulling-up node, gates of the transistor TA2 and the transistor TA9 are connected to the drains of the fifth transistor TC5 and the tenth transistor TC10 in the scanning sequence control circuit, respectively, and drains of the transistor TA2 and the transistor TA9 are connected to the power supply voltage input terminal;
- the discharging unit comprises a transistor TA6, and a source of the transistor TA6 is connected to the pulling-up node PU, a gate of the transistor TA6 is connected to the frame reset signal input terminal, a drain of the transistor TA6 is connected to the power supply voltage input terminal;
- the holding unit comprises a transistor TA3, a transistor TA5, a transistor TA7, a transistor TA8, a transistor TA10, a transistor TA11, a transistor TA12, a transistor TA13, a capacitor CA8 and a capacitor CA9, wherein a source of the transistor TA11 is coupled to the drains of the first transistor TC1 and the fourth transistor TC4 in the scanning sequence control circuit, respectively, gates of the transistor TA11 and the transistor TA5 are connected to the drains of the fourteenth transistor TC14 and the fifteenth transistor TC15 in the scanning sequence control circuit, a drain of the transistor TA11 is connected to a source of the transistor TA10 and the pulling-up node PU, respectively, a gate of the transistor TA10, a source and a gate of the transistor TA12, a first terminal of the capacitor CA8, and a source of the transistor TA7 are commonly connected to the drains of the thirteenth transistor TC13 and the sixteenth transistor TC16 in the scanning sequence control circuit, a drain of the transistor TA10, a source of the transistor TA5, a gate of the transistor TA13, a gate of the transistor TA8 and a source of the transistor TA3 are commonly connected to the second terminal of the capacitor CA6 and the first gate signal output terminal; drains of the transistor TA5, the transistor TA13, the transistor TA8 and the transistor TA3 are commonly connected to the power supply voltage input terminal, a drain of the transistor TA12 is connected to a gate of the transistor TA7, a source of the transistor TA13, a second terminal of the capacitor CA8 and a first terminal of the capacitor CA9, respectively, and a drain of the transistor TA7, a second terminal of the capacitor CA9, a source of the transistor TA8 and a gate of the transistor TA3 are connected to the pulling-down node PD.

6. The shift register of claim 4, wherein the second control circuit comprises a buffering unit, a charging unit, a pulling-up unit, a carry signal generating unit, a pulling-down unit, a discharging unit and a holding unit, wherein:
the buffering unit comprises a transistor TB4, and a source and a gate of the transistor TB4 are coupled to the drains of the second transistor TC2 and the third transistor TC3 in the scanning sequence control circuit, and a drain of the transistor TB4 is connected to the pulling-up node;
the charging unit comprises a capacitor CB6, and a first terminal of the capacitor CB6 is connected to the pulling-up node, a second terminal of the capacitor CB6 is connected to the second gate signal output terminal;
the pulling-up unit comprises a transistor TB1, and a source of the transistor TB1 is connected to the drains of the fourteenth transistor TC14 and the fifteenth transistor TC15 in the scanning sequence control circuit, a gate of the transistor TB1 is connected to the first terminal of the capacitor CB6, and a drain of the transistor TB1 is connected to the second gate signal output terminal;
the carry signal generating unit comprises a transistor TB15 and a capacitor CB7, wherein a source of the transistor TB15 is connected to the drains of the fourteenth transistor TC14 and the fifteenth transistor TC15 in the scanning sequence control circuit, respectively, a gate of the transistor TB15 is connected to a first terminal of the capacitor CB7 and the pulling-up node PU, respectively, and a drain of the transistor TB15 is connected to a second terminal of the capacitor CB7 and the sources of the fourth transistor TC4 and the seventh transistor TC7 in the scanning sequence control circuit, respectively;
the pulling-down unit comprises a transistor TB2 and a transistor TB9, wherein a source of the transistor TB2 is connected to the second gate signal output terminal, a source of the transistor TB9 is connected to the pulling-up node, gates of the transistors TB2 and TB9 are connected to the drains of the sixth transistor TC6 and the ninth transistor TC9 in the scanning sequence control circuit, respectively, and drains of the transistors TB2 and TB9 are connected to the power supply voltage input terminal;
the discharging unit comprises a transistor TB6, and a source of the transistor TB6 is connected to the pulling-up node PU, a gate of the transistor TB6 is connected to the frame reset signal input terminal, and a drain of the transistor TB6 is connected to the power supply voltage input terminal;
the holding unit comprises a transistor TB3, a transistor TB5, a transistor TB7, a transistor TB8, a transistor TB10, a transistor TB11, a transistor TB12, a transistor TB13, a capacitor CB8 and a capacitor CB9, wherein a source of the transistor TB11 is coupled to the drains of the second transistor TC2 and the third transistor TC3 in the scanning sequence control circuit, respectively, gates of the transistors TB11 and TB5 are connected to the drains of the thirteenth transistor TC13 and the sixteenth transistor TC16 in the scanning sequence control circuit, a drain of the transistor TB11 is connected to a source of the transistor TB10 and the pulling-up node PU, respectively, a gate of the transistor TB10, a source and a gate of the transistor TB12, a first terminal of the capacitor CB8 and a source of the transistor TB7 are commonly connected to the drains of the fourteenth transistor TC14 and the fifteenth transistor TC15 in the scanning sequence control circuit, a drain of the transistor TB10, a source of the transistor TB5, a gate of the transistor TB13, a gate of the transistor TB8 and a source of the transistor TB3 are commonly connected to the second terminal of the capacitor CB6 and the second gate signal output terminal, drains of the transistors TB5, TB13, TB8, TB3 are commonly connected to the power supply voltage input terminal, a drain of the transistor TB12 is connected to a gate of the transistor TB7, a source of the transistor TB13, a second terminal of the capacitor CB8 and a first terminal of the capacitor CB9, respectively, and a drain of the transistor TB7, a second terminal of the capacitor CB9, a source of the transistor TB8, and a gate of the transistor TB3 are connected to the pulling-down node PD.

7. A gate driving unit, comprising a plurality of shift register units which are connected in cascade;
a set signal input terminal of each of remaining stages of the shift registers is connected to a carry signal output terminal of a previous stage of the shift register, except that a set signal input terminal of the first stage of the shift register is connected to a clock generating unit;
a reset signal input terminal of each of remaining stages of the shift registers is connected to a reset signal output terminal of a next stage of the shift register, except that a reset signal input terminal of the last stage of the shift register is connected to the clock generating unit,
wherein the shift register unit comprises a scanning sequence control circuit, a first control circuit and a second control circuit, wherein:
the scanning sequence control circuit is connected to a first scanning sequence control signal input terminal, a second scanning sequence control signal input terminal, a first clock signal input terminal, a second clock signal input terminal, a set signal input terminal, a reset signal input terminal, a first gate signal output terminal, a second gate signal output terminal, a carry signal output terminal, and a reset signal output terminal, respectively, and the scanning sequence control circuit is configured to control output sequence of a first gate signal and a second gate signal only according to the received first scanning sequence control signal and second scanning sequence control signal;
the first control circuit is configured to output and reset the first gate signal according to the control signals input from the scanning sequence control circuit, and the first control circuit is connected to a frame reset signal input terminal, a power supply voltage input terminal, the first gate signal output terminal and the scanning sequence control circuit, respectively;

the second control circuit is configured to output and reset the second gate signal according to the control signals input from the scanning sequence control circuit, and the second control circuit is connected to the frame reset signal input terminal, the power supply voltage input terminal, the second gate signal output terminal and the scanning sequence control circuit, respectively, wherein the scanning sequence control circuit comprises:

a first control unit, configured to input a first sub-set signal and a first sub-reset signal to the first control circuit, and receive a first sub-carry signal input from the first control circuit, wherein the first control unit is connected to the first scanning sequence control signal input terminal, the set signal input terminal, the reset signal input terminal, the first gate signal output terminal, the carry signal output terminal and the reset signal output terminal, respectively;

a second control unit, configured to input a second sub-set signal and a second sub-reset signal to the second control circuit, and receive a second sub-carry signal input from the second control circuit, wherein the second control unit is connected to the second scanning sequence control signal input terminal, the set signal input terminal, the reset signal input terminal, the second gate signal output terminal, the carry signal input terminal and the reset signal output terminal, respectively;

a clock signal control unit, configured to input a first clock sub-signal and a second clock sub-signal to the first control circuit or the second control circuit, wherein the clock signal control unit is connected to the first scanning sequence control signal input terminal, the second scanning sequence control signal input terminal, the first clock signal input terminal and the second clock signal input terminal, respectively.

8. The gate driving unit of claim 7, wherein, the first control unit comprises:

a first transistor TC1, a third transistor TC3, a fifth transistor TC5, a seventh transistor TC7, a ninth transistor TC9 and a eleventh transistor TC11, wherein:

a source of the first transistor TC1 is connected to the set signal input terminal, a gate of the first transistor TC1 is connected to the first scanning sequence control signal input terminal, and the drain of the first transistor TC1 is connected to the first control circuit;

a source of the third transistor TC3 is connected to the first control circuit, a gate of the third transistor TC3 is connected to the first scanning sequence control signal input terminal, and a drain of the third transistor TC3 is connected to the second control circuit;

a source of the fifth transistor TC5 is connected to the second gate signal output terminal, a gate of the fifth transistor TC5 is connected to the first scanning sequence control signal input terminal, and a drain of the fifth transistor TC5 is connected to the first control circuit;

a source of the seventh transistor TC7 is connected to the second control circuit, a gate of the seventh transistor TC7 is connected to the first scanning sequence control signal input terminal, a drain of the seventh transistor TC7 is connected to the carry signal output terminal;

a source of the ninth transistor TC9 is connected to the reset signal input terminal, a gate of the ninth transistor TC9 is connected to the first scanning sequence control signal input terminal, and a drain of the ninth transistor TC9 is connected to the second control circuit;

a source of the eleventh transistor TC11 is connected to the first gate signal output terminal, a gate of the eleventh transistor TC11 is connected to the first scanning sequence control signal input terminal, and a drain of the eleventh transistor TC11 is connected to the reset signal output terminal.

9. The gate driving unit of claim 8, wherein the second control unit comprises:

a second transistor TC2, a fourth transistor TC4, a sixth transistor TC6, a eighth transistor TC8, a tenth transistor TC10, and a twelfth transistor TC12, wherein:

a source of the second transistor TC2 is connected to the set signal input terminal, a gate of the second transistor TC2 is connected to the second scanning sequence control signal input terminal, and a drain of the second transistor TC2 is connected to the second control circuit;

a source of the fourth transistor TC4 is connected to the second control circuit, a gate of the fourth transistor TC4 is connected to the second scanning sequence control signal input terminal, and a drain of the fourth transistor TC4 is connected to the first control circuit;

a source of the sixth transistor TC6 is connected to the first gate signal output terminal, a gate of the sixth transistor TC6 is connected to the second scanning sequence control signal input terminal, and a drain of the sixth transistor TC6 is connected to the second control circuit;

a source of the eighth transistor TC8 is connected to the first control circuit, a gate of the eighth transistor TC8 is connected to the second scanning sequence control signal input terminal, and a drain of the eighth transistor TC8 is connected to the carry signal output terminal;

a source of the tenth transistor TC10 is connected to the reset signal input terminal, a gate of the tenth transistor TC10 is connected to the second scanning sequence control signal input terminal, and a drain of the tenth transistor TC10 is connected to the first control circuit;

a source of the twelfth transistor TC12 is connected to the second gate signal output terminal, a gate of the twelfth transistor TC12 is connected to the second scanning sequence control signal input terminal, and a drain of the twelfth transistor TC12 is connected to the reset signal output terminal.

10. The gate driving unit of claim 9, wherein the clock signal control unit comprises:

a thirteenth transistor TC13, a fourteenth transistor TC14, a fifteenth transistor TC15, and a sixteenth transistor TC16, wherein:

a source of the thirteenth transistor TC13 is connected to the first clock signal input terminal, a gate of the thirteenth transistor TC13 is connected to the first scanning sequence control signal input terminal, and a drain of the thirteenth transistor TC13 is connected to the first control circuit and the second control circuit;

a source of the fourteenth transistor TC14 is connected to the first clock signal input terminal, a gate of the fourteenth transistor TC14 is connected to the second scanning sequence control signal input terminal, and a drain of the fourteenth transistor TC14 is connected to the first control circuit and the second control circuit;

a source of the fifteenth transistor TC15 is connected to the second clock signal input terminal, a gate of the fifteenth transistor TC15 is connected to the first scanning sequence control signal input terminal, and a drain of the fifteenth transistor TC15 is connected to the first control circuit and the second control circuit;

a source of the sixteenth transistor TC16 is connected to the second clock signal input terminal, a gate of the sixteenth transistor TC16 is connected to the second scanning sequence control signal input terminal, and a drain of the sixteenth transistor TC16 is connected to the first control circuit and the second control circuit.

11. The gate driving unit of claim 10, wherein the first control circuit comprises a buffering unit, a charging unit, a pulling-up unit, a carry signal generating unit, a pulling-down unit, a discharging unit and a holding unit, wherein:

the buffering unit comprises a transistor TA4, and a source and a gate of the transistor TA4 are coupled to the drains of the first transistor TC1 and the fourth transistor TC4 in the scanning sequence control circuit, and a drain of the transistor TA4 is connected to a pulling-up node;

the charging unit comprises a capacitor CA6, and a first terminal of the capacitor CA6 is connected to the pulling-up node, and a second terminal of the capacitor CA6 is connected to the first gate signal output terminal;

the pulling-up unit comprises a transistor TA1, and a source of the transistor TA1 is connected to the drains of the thirteenth transistor TC13 and the sixteenth transistor TC16 in the scanning sequence control circuit, a gate of the transistor TA1 is connected to the first terminal of the capacitor CA6, and a drain of the transistor TA1 is connected to the first gate signal output terminal;

the carry signal generating unit comprises a transistor TA15 and a capacitor CA7, wherein a source of the transistor TA15 is connected to the drains of the thirteenth transistor TC13 and the sixteenth transistor TC16 in the scanning sequence control circuit, respectively, a gate of the transistor TA15 is connected to a first terminal of the capacitor CA7 and the pulling-up node PU, respectively, and a drain of the transistor TA15 is connected to a second terminal of the capacitor CA7, the sources of the third transistor TC3 and the eighth transistor TC8 in the scanning sequence control circuit; respectively;

the pulling-down unit comprises a transistor TA2 and a transistor TA9, wherein a source of the transistor TA2 is connected to the first gate signal output terminal, a source of the transistor TA9 is connected to the pulling-up node, gates of the transistors TA2 and TA9 are connected to the drains of the fifth transistor TC5 and the tenth transistor TC10 in the scanning sequence control circuit, respectively, and drains of the transistors TA2 and TA9 are connected to the power supply voltage input terminal;

the discharging unit comprises a transistor TA6, and a source of the transistor TA6 is connected to the pulling-up node PU, a gate of the transistor TA6 is connected to the frame reset signal input terminal, a drain of the transistor TA6 is connected to the power supply voltage input terminal;

the holding unit comprises a transistor TA3, a transistor TA5, a transistor TA7, a transistor TA8, a transistor TA10, a transistor TA11, a transistor TA12, a transistor TA13, a capacitor CA8 and a capacitor CA9, wherein a source of the transistor TA11 is coupled to the drains of the first transistor TC1 and the fourth transistor TC4 in the scanning sequence control circuit, respectively, gates of the transistor TA11 and the transistor TA5 are connected to the drains of the fourteenth transistor TC14 and the fifteenth transistor TC15 in the scanning sequence control circuit, a drain of the transistor TA11 is connected to a source of the transistor TA10 and the pulling-up node PU, respectively, a gate of the transistor TA10, a source and a gate of the transistor TA12, a first terminal of the capacitor CA8, and a source of the transistor TA7 are commonly connected to the drains of the thirteenth transistor TC13 and the sixteenth transistor TC16 in the scanning sequence control circuit, a drain of the transistor TA10, a source of the transistor TA5, a gate of the transistor TA13, a gate of the transistor TA8 and a source of the transistor TA3 are commonly connected to the second terminal of the capacitor CA6 and the first gate signal output terminal; drains of the transistors TA5, TA13, TA8 and TA3 are commonly connected to the power supply voltage input terminal, a drain of the transistor TA12 is connected to a gate of the transistor TA7, a source of the transistor TA13, a second terminal of the capacitor CA8 and a first terminal of the capacitor CA9, respectively, and a drain of the transistor TA7, a second terminal of the capacitor CA9, a source of the transistor TA8 and a gate of the transistor TA3 are connected to the pulling-down node PD.

12. The gate driving unit of claim 10, wherein the second control circuit comprises a buffering unit, a charging unit, a pulling-up unit, a carry signal generating unit, a pulling-down unit, a discharging unit and a holding unit, wherein:

the buffering unit comprises a transistor TB4, and a source and a gate of the transistor TB4 are coupled to the drains of the second transistor TC2 and the third transistor TC3 in the scanning sequence control circuit, and a drain of the transistor TB4 is connected to the pulling-up node;

the charging unit comprises a capacitor CB6, and a first terminal of the capacitor CB6 is connected to the pulling-up node, a second terminal of the capacitor CB6 is connected to the second gate signal output terminal;

the pulling-up unit comprises a transistor TB1, and a source of the transistor TB1 is connected to the drains of the fourteenth transistor TC14 and the fifteenth transistor TC15 in the scanning sequence control circuit, a gate of the transistor TB1 is connected to the first terminal of the capacitor CB6, and a drain of the transistor TB1 is connected to the second gate signal output terminal;

the carry signal generating unit comprises a transistor TB15 and a capacitor CB7, wherein a source of the transistor TB15 is connected to the drains of the fourteenth transistor TC14 and the fifteenth transistor TC15 in the scanning sequence control circuit, respectively, a gate of the transistor TB15 is connected to a first terminal of the capacitor CB7 and the pulling-up node PU, respectively, and a drain of the transistor TB15 is connected to a second terminal of the capacitor CB7 and the sources of the fourth transistor TC4 and the seventh transistor TC7 in the scanning sequence control circuit, respectively;

the pulling-down unit comprises a transistor TB2 and a transistor TB9, wherein a source of the transistor TB2 is connected to the second gate signal output terminal, a source of the transistor TB9 is connected to the pulling-up node, gates of the transistors TB2 and TB9 are connected to the drains of the sixth transistor TC6 and the ninth transistor TC9 in the scanning sequence control circuit, respectively, and drains of the transistors TB2 and TB9 are connected to the power supply voltage input terminal;

the discharging unit comprises a transistor TB6, and a source of the transistor TB6 is connected to the pulling-up node PU, a gate of the transistor TB6 is connected to the frame reset signal input terminal, and a drain of the transistor TB6 is connected to the power supply voltage input terminal;

the holding unit comprises a transistor TB3, a transistor TB5, a transistor TB7, a transistor TB8, a transistor TB10, a transistor TB11, a transistor TB12, a transistor TB13, a capacitor CB8 and a capacitor CB9, wherein a source of the transistor TB11 is coupled to the drains of the second transistor TC2 and the third transistor TC3 in the scanning sequence control circuit, respectively, gates of the transistors TB11 and TB5 are connected to the drains of the thirteenth transistor TC13 and the sixteenth transistor TC16 in the scanning sequence control circuit, a drain of the transistor TB11 is connected to a source of the transistor TB10 and the pulling-up node PU, respectively, a gate of the transistor TB10, a source and a gate of the transistor TB12, a first terminal of the capacitor CB8 and a source of the transistor TB7 are commonly connected to the drains of the fourteenth transistor TC14 and the fifteenth transistor TC15 in the scanning sequence control circuit, a drain of the transistor TB10, a source of the transistor TB5, a gate of the transistor TB13, a gate of the transistor TB8 and a source of the transistor TB3 are commonly connected to the second terminal of the capacitor CB6 and the second gate signal output terminal, drains of the transistors TB5, TB13, TB8, TB3 are commonly connected to the power supply voltage input terminal, a drain of the transistor TB12 is connected to a gate of the transistor TB7, a source of the transistor TB13, a second terminal of the capacitor CB8 and a first terminal of the capacitor CB9, respectively, and a drain of the transistor TB7, a second terminal of the capacitor CB9, a source of the transistor TB8, and a gate of the transistor TB3 are connected to the pulling-down node PD.

13. A display device, comprising a gate driving unit; the display device further comprising:

a timing controller, configured to generate a stage scanning sequence control signal;

a voltage generating unit, configured to generate a gate on voltage and a gate off voltage;

a clock generating unit, configured to generate a first scanning sequence control signal and a second scanning sequence control signal based on the stage scanning sequence control signal, the gate on voltage and the gate off voltage, wherein the gate driving unit comprises a plurality of shift register units which are connected in cascade;

a set signal input terminal of each of remaining stages of the shift registers is connected to a carry signal output terminal of a previous stage of the shift register, except that a set signal input terminal of the first stage of the shift register is connected to a clock generating unit;

a reset signal input terminal of each of remaining stages of the shift registers is connected to a reset signal output terminal of a next stage of the shift register, except that a reset signal input terminal of the last stage of the shift register is connected to the clock generating unit, wherein the shift register unit comprises a scanning sequence control circuit, a first control circuit and a second control circuit, wherein:

the scanning sequence control circuit is connected to a first scanning sequence control signal input terminal, a second scanning sequence control signal input terminal, a first clock signal input terminal, a second clock signal input terminal, a set signal input terminal, a reset signal input terminal, a first gate signal output terminal, a second gate signal output terminal, a carry signal output terminal, and a reset signal output terminal, respectively, and the scanning sequence control circuit is configured to control output sequence of a first gate signal and a second gate signal only according to the received first scanning sequence control signal and second scanning sequence control signal;

the first control circuit is configured to output and reset the first gate signal according to the control signals input from the scanning sequence control circuit, and the first control circuit is connected to a frame reset signal input terminal, a power supply voltage input terminal, the first gate signal output terminal and the scanning sequence control circuit, respectively;

the second control circuit is configured to output and reset the second gate signal according to the control signals input from the scanning sequence control circuit, and the second control circuit is connected to the frame reset signal input terminal, the power supply voltage input terminal, the second gate signal output terminal and the scanning sequence control circuit, respectively, wherein the scanning sequence control circuit comprises:

a first control unit, configured to input a first sub-set signal and a first sub-reset signal to the first control circuit, and receive a first sub-carry signal input from the first control circuit, wherein the first control unit is connected to the first scanning sequence control signal input terminal, the set signal input terminal, the reset signal input terminal, the first gate signal output terminal, the carry signal output terminal and the reset signal output terminal, respectively;

a second control unit, configured to input a second sub-set signal and a second sub-reset signal to the second control circuit, and receive a second sub-carry signal input from the second control circuit, wherein the second control unit is connected to the second scanning sequence control signal input terminal, the set signal input terminal, the reset signal input terminal, the second gate signal output terminal, the carry signal input terminal and the reset signal output terminal, respectively;

a clock signal control unit, configured to input a first clock sub-signal and a second clock sub-signal to the first control circuit or the second control circuit, wherein the clock signal control unit is connected to the first scanning sequence control signal input terminal, the second scanning sequence control signal input terminal, the first clock signal input terminal and the second clock signal input terminal, respectively.

14. The display device of claim 13, wherein, when the stage scanning sequence control signal is at a high level, the first scanning sequence control signal is the gate on voltage, and the second scanning sequence control signal is the gate off voltage; and when the stage scanning sequence control signal is at a low level, the first scanning sequence control signal is the gate off voltage, and the second scanning sequence control signal is the gate on voltage.

15. The display device of claim 13, wherein, the first control unit comprises:
- a first transistor TC1, a third transistor TC3, a fifth transistor TC5, a seventh transistor TC7, a ninth transistor TC9 and a eleventh transistor TC11, wherein:
- a source of the first transistor TC1 is connected to the set signal input terminal, a gate of the first transistor TC1 is connected to the first scanning sequence control signal input terminal, and the drain of the first transistor TC1 is connected to the first control circuit;
- a source of the third transistor TC3 is connected to the first control circuit, a gate of the third transistor TC3 is connected to the first scanning sequence control signal input terminal, and a drain of the third transistor TC3 is connected to the second control circuit;
- a source of the fifth transistor TC5 is connected to the second gate signal output terminal, a gate of the fifth transistor TC5 is connected to the first scanning sequence control signal input terminal, and a drain of the fifth transistor TC5 is connected to the first control circuit;
- a source of the seventh transistor TC7 is connected to the second control circuit, a gate of the seventh transistor TC7 is connected to the first scanning sequence control signal input terminal, a drain of the seventh transistor TC7 is connected to the carry signal output terminal;
- a source of the ninth transistor TC9 is connected to the reset signal input terminal, a gate of the ninth transistor TC9 is connected to the first scanning sequence control signal input terminal, and a drain of the ninth transistor TC9 is connected to the second control circuit;
- a source of the eleventh transistor TC11 is connected to the first gate signal output terminal, a gate of the eleventh transistor TC11 is connected to the first scanning sequence control signal input terminal, and a drain of the eleventh transistor TC11 is connected to the reset signal output terminal.

16. The display device of claim 15, wherein the second control unit comprises:
- a second transistor TC2, a fourth transistor TC4, a sixth transistor TC6, a eighth transistor TC8, a tenth transistor TC10, and a twelfth transistor TC12, wherein:
- a source of the second transistor TC2 is connected to the set signal input terminal, a gate of the second transistor TC2 is connected to the second scanning sequence control signal input terminal, and a drain of the second transistor TC2 is connected to the second control circuit;
- a source of the fourth transistor TC4 is connected to the second control circuit, a gate of the fourth transistor TC4 is connected to the second scanning sequence control signal input terminal, and a drain of the fourth transistor TC4 is connected to the first control circuit;
- a source of the sixth transistor TC6 is connected to the first gate signal output terminal, a gate of the sixth transistor TC6 is connected to the second scanning sequence control signal input terminal, and a drain of the sixth transistor TC6 is connected to the second control circuit;
- a source of the eighth transistor TC8 is connected to the first control circuit, a gate of the eighth transistor TC8 is connected to the second scanning sequence control signal input terminal, and a drain of the eighth transistor TC8 is connected to the carry signal output terminal;
- a source of the tenth transistor TC10 is connected to the reset signal input terminal, a gate of the tenth transistor TC10 is connected to the second scanning sequence control signal input terminal, and a drain of the tenth transistor TC10 is connected to the first control circuit;
- a source of the twelfth transistor TC12 is connected to the second gate signal output terminal, a gate of the twelfth transistor TC12 is connected to the second scanning sequence control signal input terminal, and a drain of the twelfth transistor TC12 is connected to the reset signal output terminal.

17. The display device of claim 16, wherein the clock signal control unit comprises:
- a thirteenth transistor TC13, a fourteenth transistor TC14, a fifteenth transistor TC15, and a sixteenth transistor TC16, wherein:
- a source of the thirteenth transistor TC13 is connected to the first clock signal input terminal, a gate of the thirteenth transistor TC13 is connected to the first scanning sequence control signal input terminal, and a drain of the thirteenth transistor TC13 is connected to the first control circuit and the second control circuit;
- a source of the fourteenth transistor TC14 is connected to the first clock signal input terminal, a gate of the fourteenth transistor TC14 is connected to the second scanning sequence control signal input terminal, and a drain of the fourteenth transistor TC14 is connected to the first control circuit and the second control circuit;
- a source of the fifteenth transistor TC15 is connected to the second clock signal input terminal, a gate of the fifteenth transistor TC15 is connected to the first scanning sequence control signal input terminal, and a drain of the fifteenth transistor TC15 is connected to the first control circuit and the second control circuit;
- a source of the sixteenth transistor TC16 is connected to the second clock signal input terminal, a gate of the sixteenth transistor TC16 is connected to the second scanning sequence control signal input terminal, and a drain of the sixteenth transistor TC16 is connected to the first control circuit and the second control circuit.

* * * * *